United States Patent
Lampert et al.

(10) Patent No.: US 10,847,705 B2
(45) Date of Patent: Nov. 24, 2020

(54) REDUCING CROSSTALK FROM FLUX BIAS LINES IN QUBIT DEVICES

(71) Applicant: Intel Corporation, Santa Clara, CA (US)

(72) Inventors: Lester Lampert, Portland, OR (US); Adel A. Elsherbini, Chandler, AZ (US); James S. Clarke, Portland, OR (US); Jeanette M. Roberts, North Plains, OR (US); Ravi Pillarisetty, Portland, OR (US); David J. Michalak, Portland, OR (US); Kanwaljit Singh, Rotterdam (NL); Roman Caudillo, Portland, OR (US); Zachary R. Yoscovits, Beaverton, OR (US); Nicole K. Thomas, Portland, OR (US); Hubert C. George, Portland, OR (US); Stefano Pellerano, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/897,712

(22) Filed: Feb. 15, 2018

(65) Prior Publication Data

US 2019/0044044 A1 Feb. 7, 2019

(51) Int. Cl.
*H01L 39/02* (2006.01)
*H01L 39/22* (2006.01)
(Continued)

(52) U.S. Cl.
CPC .......... *H01L 39/025* (2013.01); *G06N 10/00* (2019.01); *H01L 27/18* (2013.01); *H01L 39/223* (2013.01)

(58) Field of Classification Search
None
See application file for complete search history.

(56) References Cited

U.S. PATENT DOCUMENTS 4,176,290 A 11/1979 Ishida et al.
5,355,085 A * 10/1994 Igarashi ............ G01R 33/0356
324/248

(Continued)

FOREIGN PATENT DOCUMENTS

JP 2010511293 4/2010
WO 2008064491 A1 6/2008
(Continued)

OTHER PUBLICATIONS

International Search Report and Written Opinion in International Patent Application No. PCT/US2017/024396 dated Dec. 15, 2016, 9 pages).

(Continued)

*Primary Examiner* — Robert K Carpenter
(74) *Attorney, Agent, or Firm* — Patent Capital Group

(57) ABSTRACT

Embodiments of the present disclosure describe two approaches to providing flux bias line structures for superconducting qubit devices. The first approach, applicable to flux bias line structures that include at least one portion that terminates with a ground connection, resides in terminating such a portion with a ground connection that is electrically isolated from the common ground plane of a quantum circuit assembly. The second approach resides in providing a SQUID loop of a superconducting qubit device and a portion of the flux bias line structure over a portion of a substrate that is elevated with respect to other portions of the substrate. These approaches may be used or alone or in combination, and may improve grounding of and reduce crosstalk caused by flux bias lines in quantum circuit assemblies.

25 Claims, 17 Drawing Sheets

(51) Int. Cl.
*H01L 27/18* (2006.01)
*G06N 10/00* (2019.01)

(56) References Cited

U.S. PATENT DOCUMENTS

| | | |
|---|---|---|
| 8,610,453 B2 | 12/2013 | Herr |
| 8,654,578 B2 | 2/2014 | Lewis et al. |
| 2003/0111661 A1 | 6/2003 | Tzalenchuk et al. |
| 2004/0173787 A1 | 9/2004 | Blais et al. |
| 2009/0173936 A1 | 7/2009 | Bunyk |
| 2011/0057169 A1 | 3/2011 | Harris et al. |
| 2012/0187378 A1 | 7/2012 | Bonderson et al. |
| 2012/0319085 A1 | 12/2012 | Gambetta et al. |
| 2014/0235450 A1 | 8/2014 | Chow et al. |
| 2014/0264285 A1 | 9/2014 | Chow et al. |
| 2014/0264286 A1 | 9/2014 | Chang et al. |
| 2016/0079968 A1 | 3/2016 | Strand et al. |
| 2016/0148112 A1 | 5/2016 | Kwon |
| 2018/0004635 A1 | 1/2018 | Murthy |
| 2019/0006572 A1 | 1/2019 | Falcon et al. |
| 2019/0044048 A1 | 2/2019 | George et al. |
| 2019/0055038 A1 | 3/2019 | Jeon et al. |
| 2019/0066840 A1 | 4/2019 | Schoenberg |
| 2019/0066843 A1 | 4/2019 | Carlson |
| 2019/0131511 A1 | 5/2019 | Clarke et al. |
| 2019/0140073 A1 | 5/2019 | Pillarisetty et al. |
| 2019/0147359 A1* | 5/2019 | Chen ............... G06N 10/00 |
| 2019/0148530 A1 | 5/2019 | Pillarisetty et al. |
| 2019/0157393 A1 | 5/2019 | Roberts et al. |
| 2019/0164077 A1 | 5/2019 | Roberts et al. |
| 2019/0164959 A1 | 5/2019 | Thomas et al. |
| 2019/0165152 A1 | 5/2019 | Roberts et al. |
| 2019/0117883 A1 | 6/2019 | Abrams et al. |
| 2019/0117929 A1 | 6/2019 | Reinberg |
| 2019/0117930 A1 | 6/2019 | Al-Ali |
| 2019/0117972 A1 | 6/2019 | Schmidt et al. |
| 2019/0117973 A1 | 6/2019 | Schmidt et al. |
| 2019/0117974 A1 | 6/2019 | Creasey et al. |
| 2019/0117975 A1 | 6/2019 | Grossman et al. |
| 2019/0117977 A1 | 6/2019 | Puleo et al. |
| 2019/0125348 A1 | 6/2019 | Shelton, IV et al. |
| 2019/0125423 A1 | 6/2019 | Hinton et al. |
| 2019/0125456 A1 | 6/2019 | Shelton, IV et al. |
| 2019/0125498 A1 | 6/2019 | Bernhard |
| 2019/0125499 A1 | 6/2019 | Uchitel et al. |
| 2019/0125500 A1 | 6/2019 | Oskam et al. |
| 2019/0125501 A1 | 6/2019 | Esbech et al. |
| 2019/0181256 A1 | 6/2019 | Roberts et al. |
| 2019/0194016 A1 | 6/2019 | Roberts et al. |
| 2019/0198618 A1 | 6/2019 | George et al. |
| 2019/0132963 A1 | 7/2019 | Yu et al. |
| 2019/0133027 A1 | 7/2019 | Herbster |
| 2019/0135769 A1 | 7/2019 | Thimmaiah et al. |
| 2019/0135770 A1 | 7/2019 | Plemper et al. |
| 2019/0135771 A1 | 7/2019 | Teverovskiy et al. |
| 2019/0206991 A1 | 7/2019 | Pillarisetty et al. |
| 2019/0206992 A1 | 7/2019 | George et al. |
| 2019/0206993 A1 | 7/2019 | Pillarisetty et al. |
| 2019/0214385 A1 | 7/2019 | Roberts et al. |
| 2019/0221659 A1 | 7/2019 | George et al. |
| 2019/0229188 A1 | 7/2019 | Clarke et al. |
| 2019/0229189 A1 | 7/2019 | Clarke et al. |
| 2019/0252377 A1 | 8/2019 | Clarke et al. |
| 2019/0259850 A1 | 8/2019 | Pillarisetty et al. |
| 2019/0266511 A1 | 8/2019 | Pillarisetty et al. |
| 2019/0267692 A1 | 8/2019 | Roberts et al. |
| 2019/0273197 A1 | 9/2019 | Roberts et al. |
| 2019/0288176 A1 | 9/2019 | Yoscovits et al. |
| 2019/0296214 A1 | 9/2019 | Yoscovits et al. |
| 2019/0305037 A1 | 10/2019 | Michalak et al. |
| 2019/0305038 A1 | 10/2019 | Michalak et al. |
| 2019/0312128 A1 | 10/2019 | Roberts et al. |
| 2019/0334020 A1 | 10/2019 | Amin et al. |
| 2019/0341459 A1 | 11/2019 | Pillarisetty et al. |
| 2019/0341540 A1* | 11/2019 | Megrant ............... H01L 39/08 |
| 2019/0363181 A1 | 11/2019 | Pillarisetty et al. |
| 2019/0363239 A1 | 11/2019 | Yoscovits et al. |

FOREIGN PATENT DOCUMENTS

| | | |
|---|---|---|
| WO | 2015013532 | 1/2015 |
| WO | 2016069032 A1 | 5/2016 |
| WO | 2017155531 A1 | 9/2017 |
| WO | 2017213638 A1 | 12/2017 |
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018004634 | 1/2018 |
| WO | 2018004635 A1 | 1/2018 |
| WO | 2018004636 A1 | 1/2018 |
| WO | 2018030977 A1 | 2/2018 |
| WO | 2018044267 A1 | 3/2018 |
| WO | 2018057013 A1 | 3/2018 |
| WO | 2018057015 A1 | 3/2018 |
| WO | 2018057018 A1 | 3/2018 |
| WO | 2018057023 A1 | 3/2018 |
| WO | 2018057024 A1 | 3/2018 |
| WO | 2018057027 A1 | 3/2018 |
| WO | 2018063139 A1 | 4/2018 |
| WO | 2018063168 A1 | 4/2018 |
| WO | 2018063170 A1 | 4/2018 |
| WO | 2018063202 A1 | 4/2018 |
| WO | 2018063203 A1 | 4/2018 |
| WO | 2018063205 A1 | 4/2018 |
| WO | 2018106215 A1 | 6/2018 |
| WO | 2018118098 A1 | 6/2018 |
| WO | 2018143986 A1 | 8/2018 |
| WO | 2018160184 A1 | 9/2018 |
| WO | 2018160185 A1 | 9/2018 |
| WO | 2018160187 A1 | 9/2018 |
| WO | 2018164656 A1 | 9/2018 |
| WO | 2018182571 A1 | 10/2018 |
| WO | 2018182584 A1 | 10/2018 |
| WO | 2018200006 A1 | 11/2018 |
| WO | 2018231212 A1 | 12/2018 |
| WO | 2018231241 A1 | 12/2018 |
| WO | 2018236374 A1 | 12/2018 |
| WO | 2018236403 A1 | 12/2018 |
| WO | 2018236404 A1 | 12/2018 |
| WO | 2018236405 A1 | 12/2018 |
| WO | 2019004990 A1 | 1/2019 |
| WO | 2019004991 A1 | 1/2019 |
| WO | 2019032114 A1 | 2/2019 |
| WO | 2019032115 A1 | 2/2019 |

OTHER PUBLICATIONS

"A surface code quantum computer in silicon," Charles D. Hill, et al., Science Advances vol. 1, No. 9, e1500707, Oct. 30, 2015.

"An opto-magneto-mechanical quantum interface between distant superconducting qubits," Keyu Xia et al., Scientific Reports 4, Article No. 5571, Jul. 4, 2014.

"Cryogenic Control Architecture for Large-Scale Quantum Computing," Hornibrook, J.M., et al., arXiv:1409.2202v1 [cond-mat.mes-hall] Sep. 8, 2014; 8 pages.

"Fabrication and Characterization of Aluminum Airbridges for Superconducting Microwave Circuits," Chen, Zijun, et al., arXiv:1310.2325v1 [condo-mat.mes-hall] Oct. 9, 2013, 8 pages.

International Search Report and Written Opinion in International Patent Application No. PCT/US2016/040602 dated Mar. 31, 2017, 8 pages.

International Search Report and Written Opinion in International Patent Application No. PCT/US2016/040603 dated Apr. 28, 2017; 11 pages.

(56) References Cited

OTHER PUBLICATIONS

International Search Report and Written Opinion in International Patent Application No. PCT/US2016/054039 dated May 24, 2017; 12 pages.

"Independent, extensible control of same-frequency superconducting qubits by selective broadcasting," Asaad et al., Netherlands Organisation for Applied Scientific Research, Aug. 28, 2015, 17 pages.

"Multilayer microwave integrated quantum circuits for scalable quantum computing," Brecht et al, Department of Applied Physics, Yale University, Sep. 4, 2015, 5 pages.

"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.

"Surface loss simulations of superconducting coplanar waveguide resonators," Wenner et al, Applied Physics Letters 99, 113513 (2011), pp. 113513-1 through 3.

"Magnetic field tuning of coplanar waveguide resonators," Healey, et al., Applied Physics Letters 93, 043513 (2008), pp. 043513-1 through 3 (4 pages with cover sheet).

"Embracing the quantum limit in silicon computing," Morton et al, Macmillan Publishers, Nov. 17, 2011, vol. 479, Nature, pp. 345-353.

"Scalable quantum circuit and control for a superconducting surface code," Versluis et al, Netherlands Organisation for Applied Scientific Research, Dec. 28, 2016, 9 pages.

"Suspending superconducting qubits by silicon micromachining," Chu et al., Department of Applied Physics, Yale University, Jun. 10, 2016, 10 pages.

International Search Report and Written Opinion in International Patent Application No. PCT/US2016/040601 dated Mar. 31, 2017, 8 pages.

"Concentric Transmon qubit featuring fast turnability and an anisotropic magnetic dipole moment," Braumuller et al., Applied Physics Letters, 108:3, Jan. 2016.

\* cited by examiner

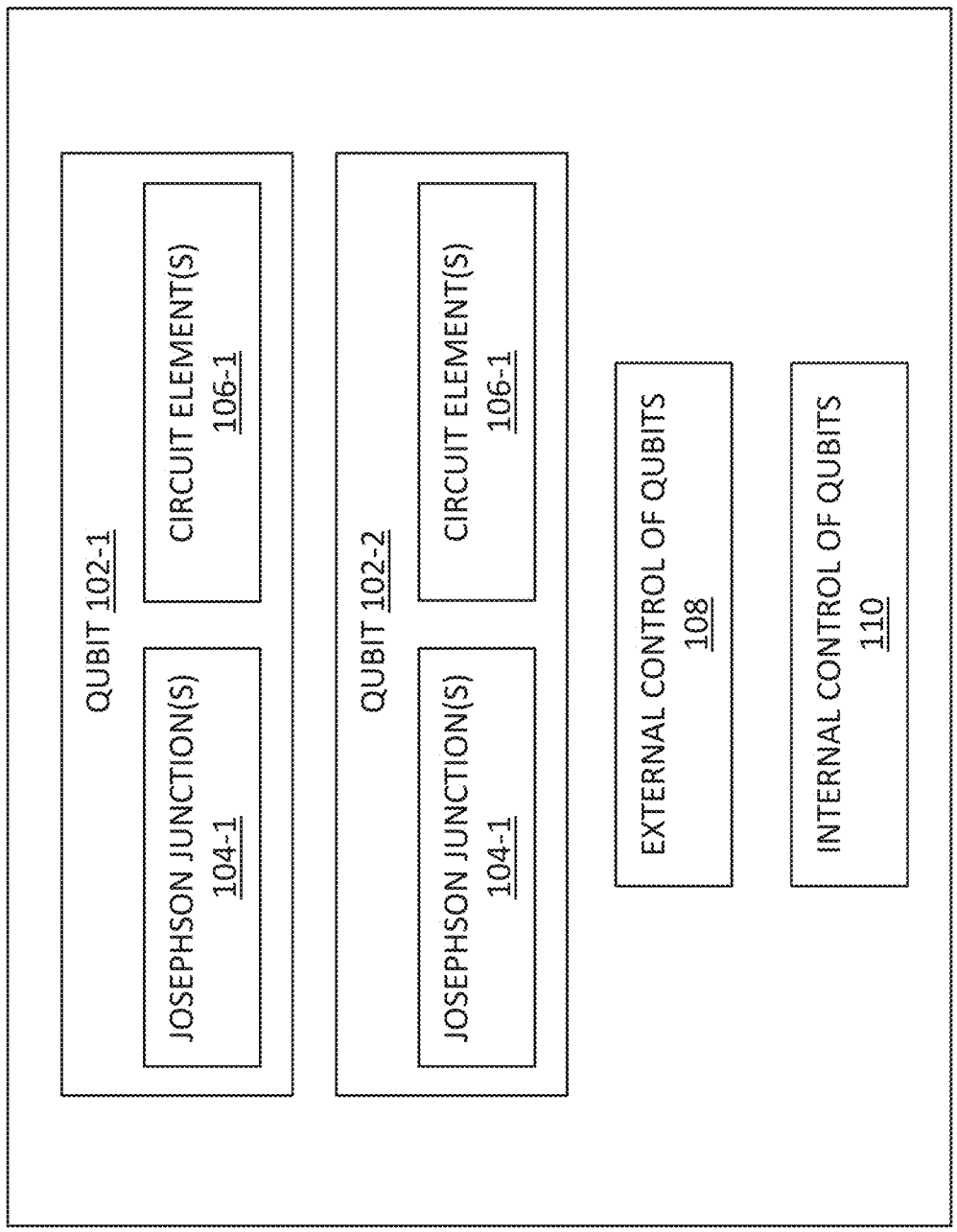

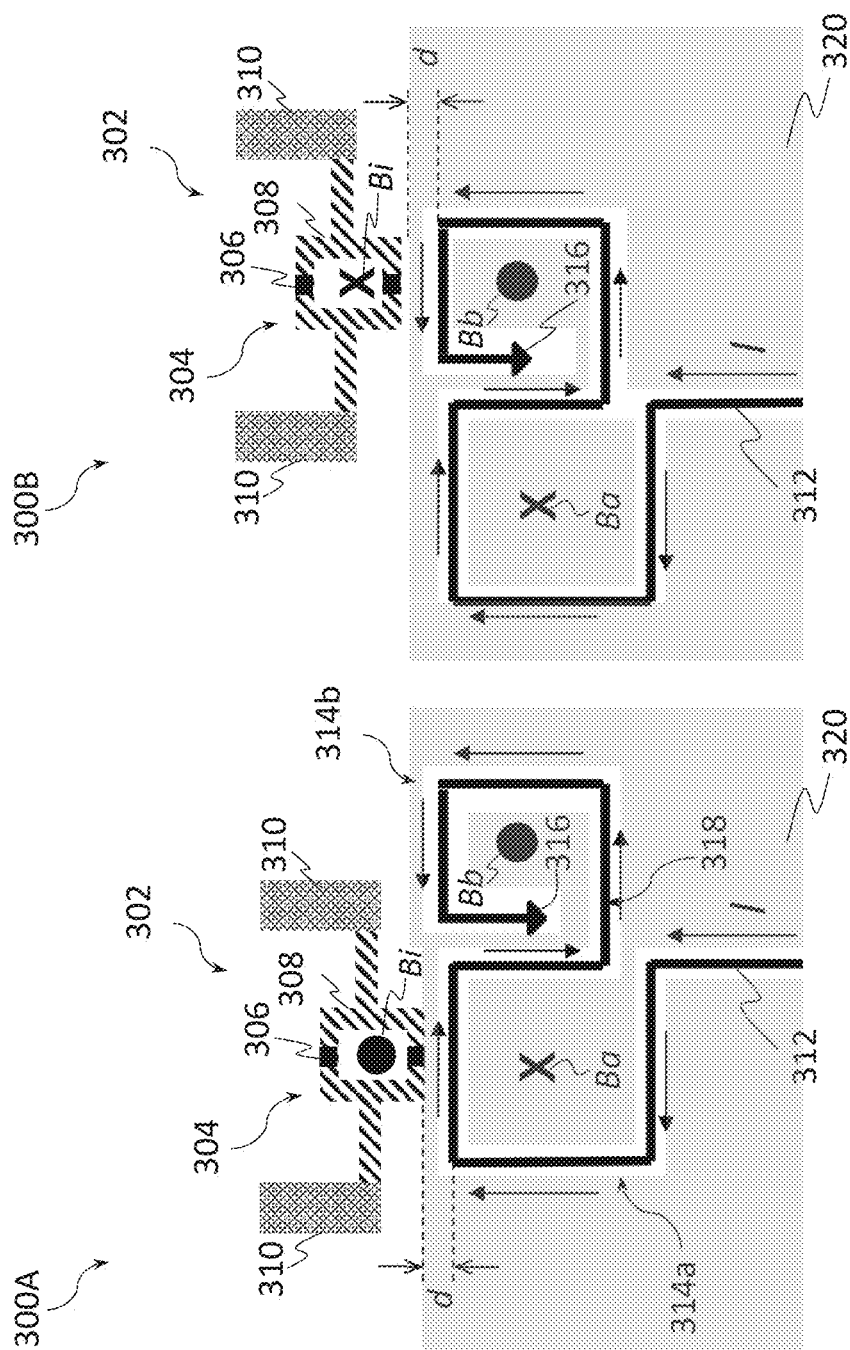

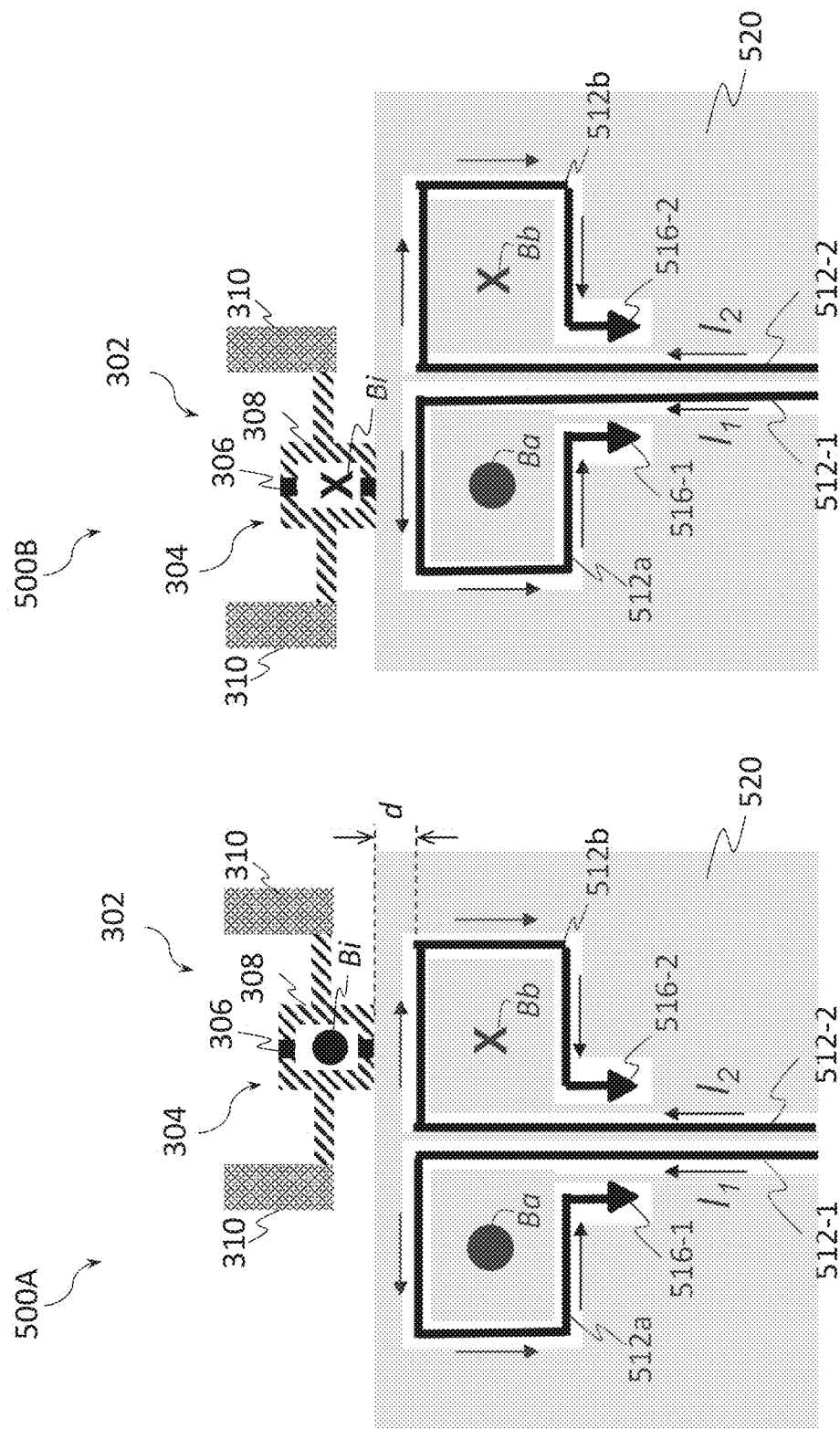

REDUCING CROSSTALK FROM FLUX BIAS LINES IN QUBIT DEVICES

TECHNICAL FIELD

This disclosure relates generally to the field of quantum computing, and more specifically, to flux bias lines for use in quantum circuit/qubit devices.

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Designing and manufacturing quantum circuits is a nontrivial task because the unique quantum-mechanical phenomena in such circuits lead to unique considerations which never had to be dealt with in classical, non-quantum, circuits, such as e.g. taking precautions in protecting qubits from decoherence so that they can stay in their information-holding states long enough to perform the necessary calculations and read out the results, and ability to operate at cryogenic temperatures. That is why, compared to well-established and thoroughly researched classical computers, quantum computing is still in its infancy, with the highest number of qubits in a solid-state quantum processor currently being below 100 and with the current manufacturing approaches being far from those which could be used in large-scale manufacturing. As the applications needing quantum circuits grow, the need for quantum circuit assemblies having improved performance also grows.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1A provides a schematic illustration of a superconducting quantum circuit, according to some embodiments of the present disclosure.

FIGS. 3A-3B provide schematic illustrations of exemplary physical layouts of a SQUID portion of a quantum circuit assembly and a flux bias line structure with a single center conductor line forming two partial loops and terminating with a ground connection, according to various embodiments of the present disclosure.

FIGS. 5A-5B provide schematic illustrations of exemplary physical layouts of a SQUID portion of a quantum circuit assembly and a flux bias line structure with two separately driven center conductor lines each forming a partial loop, according to various embodiments of the present disclosure.

DETAILED DESCRIPTION

Overview

Figure 1B:
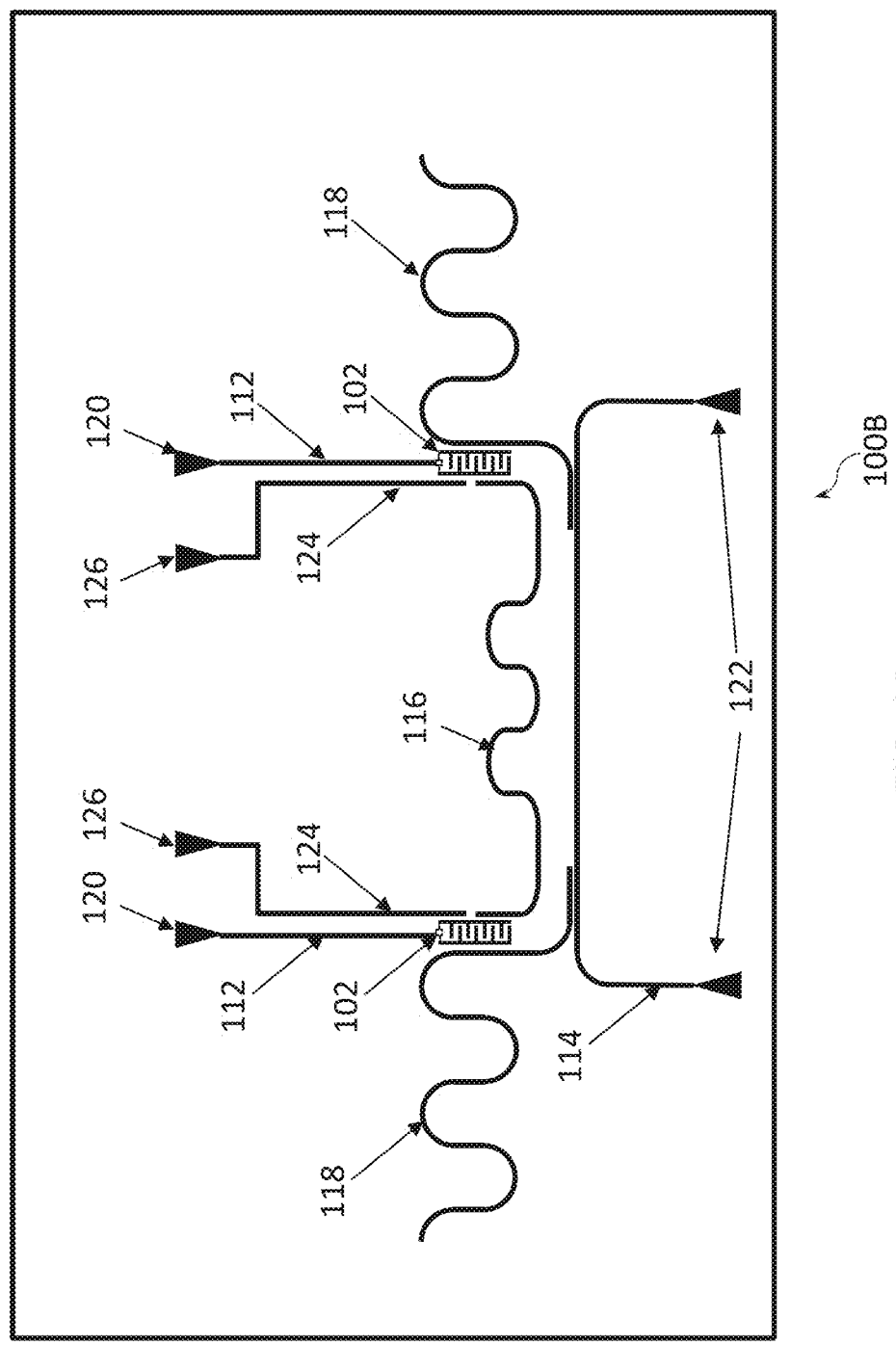
FIG. 1B provides a schematic illustration of an exemplary physical layout of a superconducting quantum circuit, according to some embodiments of the present disclosure.

As briefly described above, quantum computing, or quantum information processing, refers to the field of research related to computation systems that use quantum-mechanical phenomena to manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles being generated or interacting in such a way that the state of one particle becomes intertwined with that of the others. Furthermore, the quantum state of each particle cannot be described independently. Instead, the quantum state is given for the group of entangled particles as a whole. Yet another example of quantum-mechanical phenomena is sometimes described as a "collapse" because it asserts that when we observe (measure) particles, we unavoidably change their properties in that, once observed, the particles cease to be in a state of superposition or entanglement (i.e. by trying to ascertain anything about the particles, we collapse their state).

Put simply, superposition postulates that a given particle can be simultaneously in two states, entanglement postulates that two particles can be related in that they are able to instantly coordinate their states irrespective of the distance between them in space and time, and collapse postulates that when one observes a particle, one unavoidably changes the state of the particle and its' entanglement with other particles. These unique phenomena make manipulation of data in quantum computers significantly different from that of classical computers (i.e. computers that use phenomena of classical physics). Therefore, both the industry and the academics continue to focus on a search for new and improved physical systems whose functionality could approach that expected of theoretically designed qubits. Physical systems for implementing qubits that have been explored until now include e.g. superconducting qubits (e.g. transmon qubits or simply "transmons"), semiconducting qubits including those made using quantum dots (e.g., quantum dot spin qubits and charge qubits), photon polarization qubits, single trapped ion qubits, etc.

Out of the various physical implementations of qubits, superconducting qubits are promising candidates for building a quantum computer, where, in general, superconducting qubits refer to qubit devices that operate based on Josephson effect which is a macroscopic quantum phenomenon of supercurrent, i.e. a current that, due to zero electrical resistance, flows indefinitely long without any voltage applied, across a nonlinear inductive device known as a Josephson Junction. One challenge with qubits in general, and superconducting qubits in particular, remains in protecting qubits from decoherence (i.e. loss of state, and, therefore loss of information that a qubit is supposed to hold). For this reason, materials, fabrication methods, and layout designs used for building quantum circuits continuously focus on reducing spurious (i.e. unintentional and undesirable) two-level systems (TLS's), thought to be the dominant source of qubit decoherence, where, in general, as used in quantum mechanics, a two-level (also referred to as "two-state") system is a system that can exist in any quantum superposition of two independent and physically distinguishable quantum states.

Josephson Junctions are integral building blocks in quantum circuits employing superconducting qubit devices, forming the basis of quantum circuit elements that can approximate functionality of theoretically designed qubits. In particular, a pair of Josephson Junctions and a loop of a superconducting material (i.e. a superconducting loop) connecting them form a so-called superconducting quantum interference device (SQUID). Applying magnetic fields to the SQUID region of a superconducting qubit allows controlling a frequency of the qubit which, in turn, allows controlling whether the qubit interacts with other components of a quantum circuit, e.g. with other qubits.

Applying magnetic fields to the SQUID region of a superconducting qubit is generally referred to as a "flux control" of a qubit. Such magnetic fields may be generated by providing direct current (DC) or a pulse of current through an electrically conductive line generally referred to as a "flux bias line" (also known as a "flux line" or a "flux coil line"). By providing flux bias lines sufficiently close to SQUIDs (i.e. by providing at least some portions of flux bias lines proximate to SQUIDS), magnetic fields generated as a result of currents running through the flux bias lines extend to the SQUIDs, thus tuning qubit frequencies.

Generating a magnetic field that can tune the frequency of a qubit with sufficient degree of control while ensuring that this magnetic field does not affect other components of a quantum circuit/qubit device is not an easy task. Improvements in flux bias lines on one or both of these goals are always desirable.

Embodiments of the present disclosure describe two approaches to providing flux bias line structures that aim to generate magnetic fields for the SQUID loops of superconducting qubit devices with sufficient degree of control while reducing the effects of the currents causing the generation of the magnetic fields on other components of a quantum circuit assembly/device. The first approach, applicable to flux bias line structures that include at least one portion that terminates with a ground connection, resides in terminating such a portion with a ground connection that is electrically isolated from the common ground plane of a quantum circuit assembly. In the following, a flux bias line ground connection that is electrically isolated from the common ground plane is referred to as a "designated" ground connection of a flux bias line because the connection is specific to the flux bias line and is not connected to the common ground plane. The second approach resides in providing a SQUID and a portion of the flux bias line structure closest to the SQUID over a portion of a substrate that is elevated with respect to other portions of the substrate. In the following, a portion of a quantum circuit assembly that includes a portion of the substrate that is elevated with respect to at least some other portions and houses a SQUID and a portion of a flux bias line structure closest to the SQUID (i.e. the portion that generates the magnetic fields that can extend to the SQUID and tune the frequency of a qubit) is referred to as a "raised portion." For each of the first and second approaches various exemplary architectures of flux bias lines are illustrated and described herein. For example, FIGS. 2-5 provide schematic illustrations of exemplary physical layouts of a SQUID portion of a quantum circuit assembly and a flux bias line structure terminating with one or more designated ground connections according to the first approach, while FIGS. 6-11 provide schematic illustrations of exemplary physical layouts of a SQUID portion of a quantum circuit assembly and a flux bias line structure with a raised portion according to the second approach. In various embodiments, the first and second approaches may be implemented individually (i.e. as alternatives to implementing flux bias lines) or in combination (e.g. various embodiments of flux bias lines with one or more designated ground connections according to the first approach may also implement a raised portion according to the second approach, and vice versa). Each of the first and second approaches may improve grounding of flux bias lines in quantum circuit assemblies employing superconducting qubits, which may reduce crosstalk caused by the currents in such lines. In turn, reducing crosstalk may simplify qubit control, improve qubit fidelity, and improve overall microwave purity and quantum circuit performance.

Various embodiments of the present disclosure provide new flux bias line configurations for controlling frequencies of superconducting qubits. One exemplary flux bias line structure includes a single center conductor line forming two partial loops. Another exemplary structure includes two separately driven center conductor lines, each of the two center conductor lines forming a respective partial loop. Yet another exemplary flux bias line structure includes a single center conductor line split into two center conductor lines, each of the two center conductor lines forming a respective partial loop and comprising a respective inductor loop. Such structures may provide improvements over conventional flux bias lines in generating a magnetic field that can tune the frequency of a qubit with sufficient degree of control while ensuring that the magnetic field does not substantially affect other components of a quantum circuit placed at farther distance.

As used herein, the term "line" in context of e.g. flux bias lines described herein does not necessarily imply a straight line. In fact, portions of any of the flux bias lines described herein may be formed with any suitable geometry according to various embodiments of the present disclosure, such as e.g. a straight line, a curved line, a loop, etc. In particular, some of the flux bias lines described herein include one or more center conductor lines forming one or more partial loops, where the term "partial loop" refers to a shape of a line that is at least partially circular or/and curved over on itself. In other words, a partial loop formed by a portion of a center conductor line of a flux bias line structure may trace out an area on a plane of the line that is nearly but not completely enclosed—e.g., a portion of a center conductor line may trace out at least 70% of the perimeter of any enclosed two-dimensional shape such as a square, triangle, circle, or any arbitrary closed shape. In the following, the term "loop" may be used, with an understanding that the loop may be a partial loop as described above.

As used herein, the terms such as e.g. "flux bias line structure," "transmission line structure," "center conductor line structure," and "ground plane structure" may be referred to without using the word "structure." Furthermore, the term "center conductor line" may be used interchangeably with the terms such as "conductor strip," "signal path," or "signal line" as known in microwave engineering.

In order to provide substantially lossless connectivity to, from, and between the qubits, some or all of the electrically conductive portions of quantum circuit assemblies described herein may be made from one or more superconductive materials. However, some or all of these electrically conductive portions could be made from electrically conductive materials which are not superconductive. In the following, unless specified otherwise, reference to an electrically conductive material implies that a superconductive material can be used, and vice versa. Furthermore, materials described herein as "superconductive materials" may refer to materials, including alloys of materials, which exhibit superconducting behavior at typical qubit operating conditions (e.g. materials which exhibit superconducting behavior at very low temperatures at which qubits typically operate), but which may or may not exhibit such behavior at higher temperatures (e.g. at room temperatures). Examples of such materials include aluminum (Al), niobium (Nb), niobium nitride (NbN), titanium nitride (TiN), niobium titanium nitride (NbTiN), indium (In), and molybdenum rhenium (MoRe), all of which are particular types of superconductors at qubit operating temperatures, as well as their alloys.

While some descriptions are provided with reference to superconducting qubits, in particular to transmons, a particular class of superconducting qubits, at least some teachings of the present disclosure may be applicable to quantum circuit assembly implementations of any qubits, including superconducting qubits other than transmons and/or including qubits other than superconducting qubits, which may employ tuning the frequency of a qubit by using application of a magnetic flux generated by one or more flux bias lines as described herein, all of which implementations are within the scope of the present disclosure. For example, flux bias line structures as described herein may be used in hybrid semiconducting-superconducting quantum circuit assemblies.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g. FIGS. 3A-3B, such a collection may be referred to herein without the letters, e.g. as "FIG. 3."

In the drawings, some schematic illustrations of exemplary structures of various devices and assemblies described herein may be shown with precise right angles and straight lines, but it is to be understood that such schematic illustrations may not reflect real-life process limitations which may cause the features to not look so "ideal" when any of the structures described herein are examined using e.g. scanning electron microscopy (SEM) images or transmission electron microscope (TEM) images. In such images of real structures, possible processing defects could also be visible, such as e.g. not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−20% of a target value based on the context of a particular value as described herein or as known in the art. Similarly, terms indicating orientation of various elements, such as e.g. "coplanar," "perpendicular," "orthogonal," "parallel," or any other angle between the elements, generally refer to being within +/−5-20% of a target value based on the context of a particular value as described herein or as known in the art.

Furthermore, as used herein, terms indicating what may be considered an idealized behavior, such as e.g. "lossless" (or "low-loss") or "superconducting," are intended to cover functionality that may not be exactly ideal but is within acceptable margins for a given application. For example, a certain level of loss, either in terms of non-zero electrical resistance or non-zero amount of spurious TLS's may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

Still further, while the present disclosure may include references to microwave signals, this is done only because current qubits are designed to work with such signals because the energy in the microwave range is higher than thermal excitations at the temperature that qubits are typically operated at. In addition, techniques for the control and measurement of microwaves are well known. For these reasons, typical frequencies of qubits are in 1-30 GHz, e.g. in 3-10 GHz range, in order to be higher than thermal excitations, but low enough for ease of microwave engineering. However, advantageously, because excitation energy of qubits may be controlled by the circuit elements, qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

Exemplary Quantum Circuit Assemblies with Superconducting Qubits

As previously briefly explained above, quantum computing refers to the use of quantum-mechanical properties to perform calculations. Some of these properties include superposition and entanglement. Just as classical computers are composed of bits that can either be in a 1 or a 0 state, a quantum computer is composed of quantum bits (i.e., qubits) which have states of $|0\rangle$ and $|1\rangle$. Quantum mechanics allows for superpositions of the $|0\rangle$ and $|1\rangle$ states with a general form of $a|0\rangle+b|1\rangle$ where a and b are complex numbers. When a qubit state is measured, it collapses to either state $|0\rangle$ with a probability of that happening being $|a|^2$, or to state $|1\rangle$ with a probability of the latter being $|b|^2$. Taking into account the fact that $|a|^2+|b|^2=1$ (since the total probability must sum to unity) and ignoring an overall phase factor which does not have any observable effects, the general state can be re-written as $$\cos\frac{\theta}{2}|0\rangle + e^{i\varphi}\sin\frac{\theta}{2}|1\rangle,$$

where $\varphi$ is the phase difference between the two states.

Entanglement occurs when the interaction between two particles (e.g. two qubits) is such that the states of the two cannot be specified independently, but rather can only be specified for the whole system. This causes the states of the two qubits to be linked together such that measurement of one of the qubits causes the state of the other qubit to collapse.

In order to realize a quantum computer, a physical system that can act as a qubit is needed. Such a system needs to have at least two states to act as 0 and 1 states. Note that it is not necessary to have a system with exactly only two states if the spacing between each energy level is different, such that each level can be addressed individually. As previously described herein, one type of physical system that could be used to implement qubits is based on use of superconducting materials and, therefore, such qubits are typically referred to as superconducting/superconductive qubits.

In some implementations, namely when superconducting qubits are implemented as transmon qubits (also simply referred to as "transmons"), two basic elements of superconducting quantum circuits are inductors and capacitors. However, circuits made using only these two elements cannot make a system with two energy levels because, due to the even spacing between the system's energy levels, such circuits will produce harmonic oscillators with a ladder of equivalent states. A nonlinear element is needed to have an effective two-level quantum state system, or qubit. Josephson Junction is an example of such nonlinear, non-dissipative circuit element. Therefore, Josephson Junctions may form the central circuit elements of a superconducting quantum computer.

In general, a Josephson Junction acts as a superconducting tunnel junction. Cooper pairs tunnel across the barrier from one superconducting layer to the other. The electrical characteristics of this tunneling are governed by so-called Josephson relations which provide the basic equations governing the dynamics of the Josephson effect:

$$I = I_c \sin\varphi \qquad (1)$$

$$V = \frac{\hbar}{2e}\dot{\varphi} \qquad (2)$$

In these equations, $\varphi$ is the phase difference in the superconducting wave function across the junction, $I_c$ (the critical current) is the maximum current that can tunnel through the junction, which depends on the barrier thickness and the area of the junction, V is the voltage across the Josephson Junction, I is the current flowing through the Josephson Junction, $\hbar$ is the reduced Planck's constant, and e is electron's charge. Equations (1) and (2) can be combined to give an equation (3):

$$V = \frac{\hbar}{2eI_c\cos\varphi}\dot{I} \qquad (3)$$

Equation (3) looks like the equation for an inductor with inductance L:

$$L = \frac{\hbar}{2eI_C\cos\varphi} \qquad (4)$$

Since inductance is a function of $\varphi$, which itself is a function of I, the inductance of a Josephson Junction is nonlinear, which makes an LC circuit formed using a Josephson Junction as the inductor have uneven spacing between its energy states.

The foregoing provides an illustration of using a Josephson Junction in a transmon, which is one class of superconducting qubit. In other classes of superconducting qubits, such as e.g. charge qubits or flux qubits, Josephson Junctions combined with other circuit elements have similar functionality of providing the non-linearity necessary for forming an effective two-level quantum state, or qubit. In other words, when implemented in combination with other circuit elements (e.g. capacitors in transmons or superconducting loops in flux qubits), one or more Josephson Junctions allow realizing a quantum circuit element which has uneven spacing between its energy levels resulting in a unique ground and excited state system for the qubit. This is illustrated in FIG. 1A, providing a schematic illustration of a superconducting quantum circuit 100, according to some embodiments of the present disclosure. As shown in FIG. 1A, an exemplary superconducting quantum circuit 100 includes two or more qubits 102 (reference numerals following after a dash, such as e.g. qubit 102-1 and 102-2 indicate different instances of the same or analogous element). Each of the superconducting qubits 102 may include one or more Josephson Junctions 104 connected to one or more other circuit elements 106, which, in combination with the Josephson Junction(s) 104, form a nonlinear circuit providing a unique two-level quantum state for the qubit. The circuit elements 106 could be e.g. capacitors in transmons or superconducting loops in flux qubits.

As also shown in FIG. 1A, an exemplary superconducting quantum circuit 100 typically includes means 108 for providing external control of qubits 102 and means 110 for providing internal control of qubits 102. In this context, "external control" refers to controlling the qubits 102 from outside of, e.g., an integrated circuit (IC) chip comprising the qubits, including control by a user of a quantum computer, while "internal control" refers to controlling the qubits 102 within the IC chip. For example, if qubits 102 are transmon qubits, external control may be implemented by means of flux bias lines and by means of readout and drive lines (also known as "microwave lines" since qubits are typically designed to operate with microwave signals), described in greater detail below. On the other hand, internal control lines for such qubits may be implemented by means of resonators, e.g., coupling and readout resonators, also described in greater detail below.

Any one of the qubits 102, the external control means 108, and the external control means 110 of the quantum circuit 100 may be provided on, over, or at least partially embedded in a substrate (not shown in FIG. 1A).

As previously described herein, within superconducting qubit implementations, three classes may be distinguished: charge qubits, flux qubits, and phase qubits. Transmons, a type of charge qubits with the name being an abbreviation of "transmission line shunted plasma oscillation qubits", are particularly encouraging because they exhibit reduced sensitivity to charge noise. FIG. 1B provides a schematic illustration of an exemplary physical layout of a superconducting quantum circuit 100B where qubits are implemented as transmons, according to some embodiments of the present disclosure.

Similar to FIG. 1A, FIG. 1B illustrates two qubits 102. In addition, FIG. 1B illustrates flux bias lines 112, microwave lines 114, a coupling resonator 116, a readout resonator 118, and external contacts, e.g. implemented as wirebonding pads, 120 and 122. The flux bias lines 112 and the microwave lines may be viewed as examples of the external control means 108 shown in FIG. 1A. The coupling resonator 116 and the readout resonator 118 may be viewed as examples of the internal control means 110 shown in FIG. 1A.

Running a current through the flux bias lines 112, provided from the wirebonding pads, or any other contact means, 120, allows tuning (i.e. changing) the frequency of the corresponding qubits 102 to which each line 112 is connected. In general, it operates in the following manner. As a result of running the current in a particular flux bias line 112, magnetic field is created around the line. If such a magnetic field is in sufficient proximity to the qubit 102, e.g. by a portion of the flux bias line 112 being provided next to the qubit 102, the magnetic field couples to the qubit, thereby changing the spacing between the energy levels of the qubit. This, in turn, changes the frequency of the qubit since the frequency is directly related to the spacing between the energy levels via Planck's equation. The Planck's equation is $E=hv$, where E is the energy (in this case the energy difference between energy levels of a qubit), h is the Planck's constant and v is the frequency (in this case the frequency of the qubit). As this equation illustrates, if E changes, then v changes. Provided there is sufficient multiplexing, different currents can be sent down each of the flux lines allowing for independent tuning of the various qubits.

The state(s) of each qubit 102 may be read by way of its corresponding readout resonator 118. As explained below, the qubit 102 induces a resonant frequency in the readout resonator 118. This resonant frequency is then passed to the microwave lines 114 and communicated to the pads 122.

To that end, a readout resonator 118 may be provided for each qubit. The readout resonator 118 may be a transmission line that includes a capacitive connection to ground on one side and is either shorted to the ground on the other side (for a quarter wavelength resonator) or has a capacitive connection to ground (for a half wavelength resonator), which results in oscillations within the transmission line (resonance), with the resonant frequency of the oscillations being close to the frequency of the qubit. The readout resonator 118 is coupled to the qubit by being in sufficient proximity to the qubit 102, more specifically in sufficient proximity to the capacitor of the qubit 102, when the qubit is implemented as a transmon, either through capacitive or inductive coupling. Due to a coupling between the readout resonator 118 and the qubit 102, changes in the state of the qubit 102 result in changes of the resonant frequency of the readout resonator 118. In turn, because the readout resonator 118 is in sufficient proximity to the microwave line 114, changes in the resonant frequency of the readout resonator 118 induce changes in the current in the microwave line 114, and that current can be read externally via the wire bonding pads 122.

The coupling resonator 116 allows coupling different qubits together in order to realize quantum logic gates. The coupling resonator 116 is similar to the readout resonator 118 in that it is a transmission line that includes capacitive connections to ground on both sides (i.e. a half wavelength resonator), which also results in oscillations within the coupling resonator 116. Each side of the coupling resonator 116 is coupled (again, either capacitively or inductively) to a respective qubit by being in sufficient proximity to the qubit, namely in sufficient proximity to the capacitor of the qubit, when the qubit is implemented as a transmon. Because each side of the coupling resonator 116 has coupling with a respective different qubit, the two qubits are coupled together through the coupling resonator 116. In this manner, state of one qubit depends on the state of the other qubit, and the other way around. Thus, coupling resonators may be employed in order to use a state of one qubit to control a state of another qubit.

In some implementations, the microwave line 114 may be used to not only readout the state of the qubits as described above, but also to control the state of the qubits. When a single microwave line is used for this purpose, the line operates in a half-duplex mode where, at some times, it is configured to readout the state of the qubits, and, at other times, it is configured to control the state of the qubits. In other implementations, microwave lines such as the line 114 shown in FIG. 1B may be used to only readout the state of the qubits as described above, while separate drive lines such as e.g. drive lines 124 shown in FIG. 1B, may be used to control the state of the qubits. In such implementations, the microwave lines used for readout may be referred to as readout lines (e.g. readout line 114), while microwave lines used for controlling the state of the qubits may be referred to as drive lines (e.g. drive lines 124). The drive lines 124 may control the state of their respective qubits 102 by providing, using e.g. wirebonding pads 126 as shown in FIG. 1B, a microwave pulse at the qubit frequency, which in turn stimulates (i.e. triggers) a transition between the 0 and 1 state of the qubit. By varying the length of this pulse, a partial transition can be stimulated, giving a superposition of the 0 and 1 states of the qubit.

Flux bias lines, microwave lines, coupling resonators, drive lines, and readout resonators, such as e.g. those described above, together form interconnects for supporting propagation of microwave signals. Further, any other connections for providing direct electrical interconnection between different quantum circuit elements and components, such as e.g. connections from electrodes of Josephson Junctions to plates of the capacitors or to superconducting loops of SQUIDS or connections between two ground lines of a particular transmission line for equalizing electrostatic potential on the two ground lines, are also referred to herein as interconnects. Still further, the term "interconnect" may also be used to refer to elements providing electrical interconnections between quantum circuit elements and components and non-quantum circuit elements, which may also be provided in a quantum circuit, as well as to electrical interconnections between various non-quantum circuit elements provided in a quantum circuit. Examples of non-quantum circuit elements which may be provided in a quantum circuit may include various analog and/or digital systems, e.g. analog-to-digital converters, mixers, multiplexers, amplifiers, etc.

In various embodiments, the interconnects as shown in FIG. 1B could have different shapes and layouts. In general, the term "line" as used herein in context of e.g. flux bias lines, microwave lines, etc., does not imply straight lines, unless specifically stated so. For example, some flux bias lines or parts thereof (e.g. signal lines of various microwave transmission lines) may comprise more curves, wiggles, and turns while other interconnect lines or parts thereof may comprise less curves, wiggles, and turns, and some interconnect lines or parts thereof may comprise substantially straight lines. In some embodiments, various interconnects may intersect one another, in such a manner that they don't make an electrical connection, which can be done by using e.g. a bridge, bridging one interconnect over the other. As long as these interconnects operate in accordance with use of these interconnects as known in the art for which some exemplary principles were described above, quantum circuits with different shapes and layouts of the interconnects than those illustrated in FIG. 1B are all within the scope of the present disclosure.

Coupling resonators and readout resonators may be configured for capacitive coupling to other circuit elements at one or both ends in order to have resonant oscillations, whereas flux bias lines and microwave lines may be similar to conventional microwave transmission lines because there is no resonance in these lines. Each one of these interconnects may be implemented as any suitable architecture of a microwave transmission line, such as e.g. a coplanar waveguide, a stripline, a microstrip line, or an inverted microstrip line. Typical materials to make the electrically conductive portions of these interconnects (e.g. to form a center conductor line and any ground plane structures which may be present in a microwave transmission line used to implement a flux bias line structure) include aluminum (Al), niobium (Nb), niobium nitride (NbN), titanium nitride (TiN), niobium titanium (NbTi), and niobium titanium nitride (NbTiN), all of which are particular types of superconductors, at least at qubits' operating conditions. However, in various embodiments, other suitable superconductors and alloys of superconductors, as well as non-superconducting conductors and their alloys, may be used as well. As used herein, unless specified otherwise, reference to an electrically conductive material implies that a superconducting material can be used and vice versa, where the superconducting material could be any material(s) or any alloy of materials exhibiting superconductivity at qubits' operating conditions.

Figure 1C:
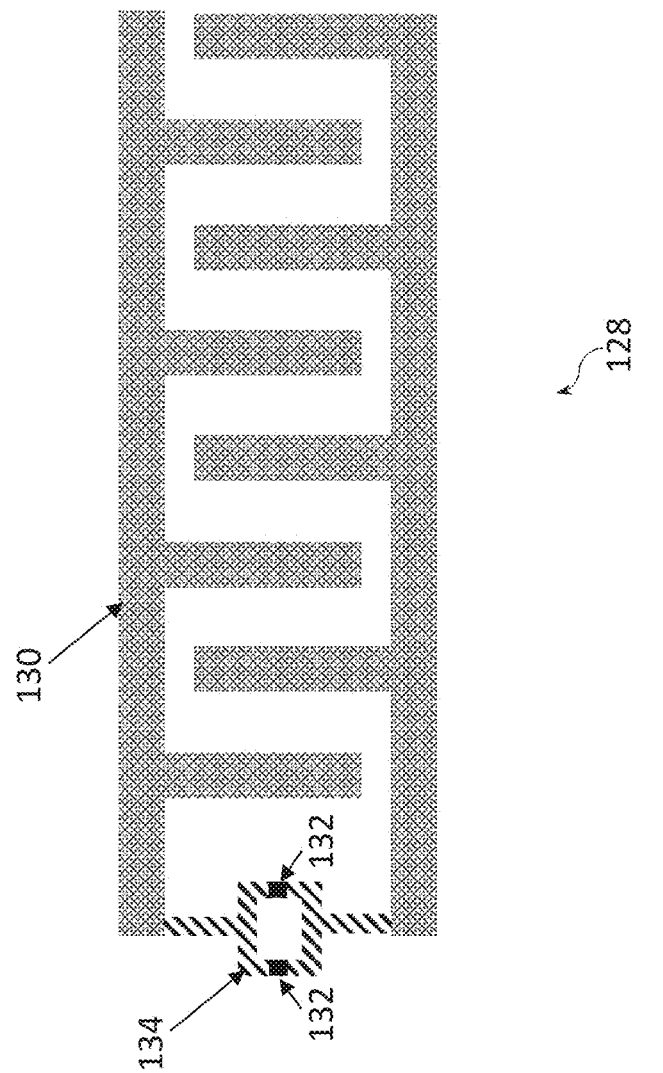
FIG. 1C provides a schematic illustration of an exemplary transmon according to some embodiments of the present disclosure.

FIG. 1C illustrates an exemplary transmon device 128 which could be used as any one of the qubits 102, according to some embodiments of the present disclosure. Presence of a capacitor 130 of such a size that capacitive energy is significantly larger than the Josephson energy in a qubit of FIG. 1C indicates that the qubit is a transmon. The capacitor 130 is configured to store energy in an electrical field as charges between the plates of the capacitor.

The capacitor 130 is depicted as an interdigitated capacitor, a particular shape of capacitor that provides a large capacitance with a small area, however, in various embodiments, other shapes and types of capacitors may be used as well. For example, such a capacitor could be implemented simply as two parallel plates with vacuum in between. Furthermore, in various embodiments, the capacitor 130 may be arranged in any direction with respect to the SQUID or a single Josephson Junction, not necessarily as shown in FIG. 1C.

In addition, the transmon illustrated in FIG. 1C includes two Josephson Junctions 132 incorporated into a superconducting loop 134. The two Josephson Junctions 132 and the superconducting loop 134 together form a SQUID. Magnetic fields generated by the flux bias line 112 extend to the SQUID (i.e. current in the flux bias line 112 create magnetic fields around the SQUID), which, in turn, tunes the frequency of the qubit.

While FIGS. 1A and 1B illustrate examples of quantum circuits comprising only two qubits 102, embodiments with any larger number of qubits are possible and are within the scope of the present disclosure. At least some of the flux bias lines 112 may be flux bias lines in the form of any of the arrangements described herein.

While FIGS. 1B and 1C illustrate embodiments specific to transmons, subject matter disclosed herein is not limited in this regard and may include other embodiments of quantum circuits implementing other types of superconducting qubits or qubits other than superconducting qubits that would also utilize flux bias lines as described herein, all of which are within the scope of the present disclosure.

In various embodiments, quantum circuit assemblies with qubit devices/circuits employing flux bias lines as described herein, e.g. quantum circuits such as the one shown in FIGS. 1A-1C, may be used to implement components associated with an IC. Such components may include those that are mounted on or embedded in an IC, or those connected to an IC. The IC may be either analog or digital and may be used in a number of applications within or associated with quantum systems, such as e.g. quantum processors, quantum amplifiers, quantum sensors, etc., as well as in a number of applications within or associated with non-quantum systems, depending on the components associated with the IC. The IC may be employed as part of a chipset for executing one or more related functions in a system.

First Approach: Flux Bias Line Structures with Designated Ground Connections

As briefly described above, the first approach to reducing crosstalk from the flux bias lines is applicable to flux bias line structures that include at least one portion that terminates with a ground connection. FIGS. 2-5 provide schematic illustrations of exemplary physical layouts of quantum circuit assemblies showing a SQUID portion and a flux bias line structure terminating with one or more designated ground connections according to various embodiments of the present disclosure.

Figure 2:
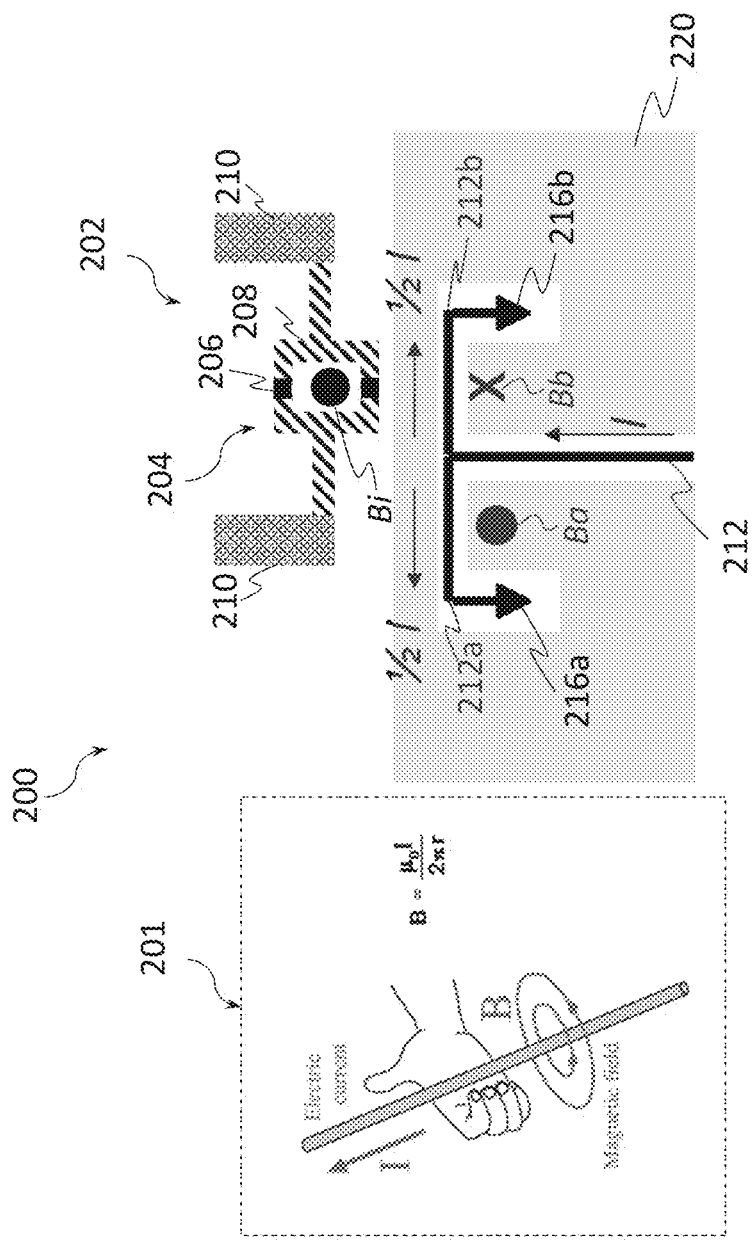
FIG. 2 provides a schematic illustration of an exemplary physical layout of a SQUID portion of a quantum circuit assembly and a flux bias line structure terminating with one or more designated ground connections, according to one embodiment of the present disclosure.

FIG. 2 providing a schematic illustration of an exemplary physical layout 200 (a top view) of a quantum circuit assembly that includes a SQUID portion 202 of a quantum circuit and a flux bias line 212 terminating with one or more designated ground connections, according to some embodiments of the present disclosure.

The SQUID portion 202 shown in FIG. 2 could e.g. be a portion of the transmon 128 shown in FIG. 1C, or other type of superconducting qubit. As shown in FIG. 2, the SQUID portion 202 includes a SQUID 204 that may include two Josephson Junctions 206 (the Josephson Junctions shown in FIG. 2 and subsequent FIGS. as black squares, only one of which being labeled with a reference numeral in order to not clutter the drawings), connected by a superconducting loop 208, the SQUID 204 being electrically connected to the capacitor 210 (only a portion of which is shown in FIG. 2; the electrical connection to the capacitor 210 is shown in FIG. 2 by the material with the pattern of the superconducting loop 208 extending to the capacitor 210).

As mentioned above, a flux bias line is placed sufficiently close to a SQUID loop of a superconducting qubit, so that the magnetic field generated by the electric current in the line can extend to the SQUID loop and tune the frequency of the qubit. Conventionally, flux bias lines have been implemented as having a single center conductor line which splits into two lines as shown in FIG. 2. More specifically, FIG. 2 illustrates that the flux bias line 212 starts as a single center conductor line originating from an external source, e.g. from a wirebonding pad or any other electrical connection to the die that houses the quantum circuit, and then splits into two branches, labeled in FIG. 2 as branches 212a and 212b, forming a T-shaped object.

In FIG. 2 and subsequent FIGS. directions of the currents which may flow in flux bias lines is shown as arrows with labels that include "I" for current, black triangles indicate ground terminations of some portions/branches of flux bias lines, while directions of the magnetic field generated by the currents in various portions of flux bias lines are shown either with a dot or with a cross, following the conventional notation used for magnetic fields going, respectively, in the direction "out of the page" or "into the page," as used to show magnetic field directions according to the right-hand rule. An inset 201 in FIG. 2 illustrates the right-hand rule. Furthermore, applicable to both FIG. 2 and subsequent FIGS. illustrating flux bias lines according to various embodiments of the present disclosure, only center conductor lines of flux bias line structures are shown. As known in the art, a flux bias line may be implemented as coplanar waveguide transmission line structure that includes a center conductor line sandwiched, in a single plane, between two ground planes. FIG. 2 and subsequent FIGS. may not specifically illustrate ground planes in order to not clutter the drawings, but it is understood that such ground planes may be present in a given flux bias line structure discussed. Furthermore, in various embodiments of the present disclosure, various types of microwave transmission line architectures may be employed, such as e.g. a coplanar waveguide, a stripline, a microstrip line, or an inverted microstrip line, each of which would include a center conductor line and one or more ground planes, where the center conductor lines of various flux bias line structures described herein can be used as the signal lines in any of these microwave transmission line architectures.

As shown in FIG. 2, the flux bias line 212 is provided so that the current I provided in the line 212 is supposed to split into two halves in the branches 212a and 212b (shown as current ½ I in the branch 212a and current ½ I in the branch 212b), each of which branches forms a partial loop. The current in the loop formed by the branch 212a results in generation of a magnetic field Ba in the direction that is perpendicular to and points out of the page of the drawing, the magnetic field Ba shown in FIG. 2 with a dot inside the branch 212a. The current in the loop formed by the branch 212b results in generation of a magnetic field Bb in the direction that is perpendicular to and points into the page of the drawing, the magnetic field Bb shown in FIG. 2 with a cross inside the branch 212a. The magnetic field Bb extends to the SQUID 204 causing the current in the SQUID loop and generation of the magnetic field Bi (where "i" of the notation "Bi" indicates "induced" magnetic field) inside the loop in the direction that is perpendicular to and points out of the page of the drawing, the magnetic field Bi shown in FIG. 2 with a dot inside the SQUID 204).

Figure 12:
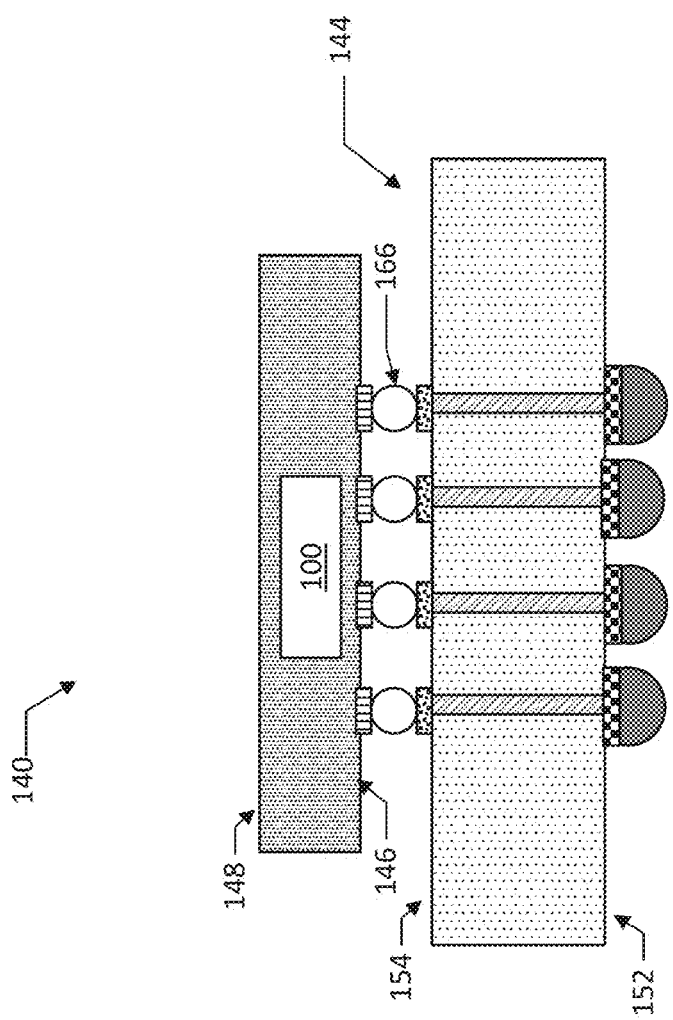
FIG. 12 provides a schematic illustration of an exemplary superconducting qubit device package coupling a die with a superconducting qubit device/quantum circuit assembly as described herein to a package substrate, according to some embodiments of the present disclosure.

The flux bias line 212 is split into two branches as shown in FIG. 2 in order to have two nearby loops with substantially equal currents flowing in the opposite directions in order to create magnetic fields in opposite directions which cancel each other at a distance and reduce crosstalk (i.e. electromagnetic interference) with other quantum circuit components. This is similar to conventional implementations of flux bias lines. However, in stark contrast to such implementations, one or both of the branches 212a and 212b may terminate with a designated ground connection 216a and 216b, respectively, instead of terminating at a common ground plane 220. FIG. 2 and subsequent FIGS. illustrating designated ground connections schematically illustrated a common ground plane, e.g. the common ground plane 220 in FIG. 2, with a light grey highlight. As is known in the art, such ground planes are typically used when a qubit die supports propagation of microwave signals in order to e.g. suppress microwave parallel plate modes, cross-coupling between circuital blocks, and substrate resonant modes. In general, providing ground planes may improve signal quality, enable fast pulse excitation and improve the isolation between the different lines. Such ground planes are typically provided in the plane of the qubits, in particular in the plane of the SQUIDs, and are referred to as "common" because the ground is shared between several different superconducting circuit elements such as qubits and resonators. Conventional flux bias lines having the architecture as shown in FIG. 2 terminate with a ground connection to such a common ground plane. As a result, currents may leak from the flux bias line onto the common ground plane and affect nearby qubits, which is undesirable. In contrast, the signal portions 216a and 216b of the flux bias line 212, including their respective ground connections 216a and 216b, are electrically isolated from the common ground plane 220, as is illustrated in FIG. 2 with those portions of the flux bias line, to not be in touch with any portions of the common ground plane 220 (i.e. they are surrounded by white portions, not light grey portions, the white portions illustrating the lack of superconductive layer of the common ground plane 220, e.g. the white portions may include a material that is not electrically conductive). Each of such designated ground connections 216a and 216b is electrically isolated from the common ground plane 220 and, instead, may be electrically connected to a further ground connection of a package substrate, e.g. a package substrate as shown in FIG. 12, described in greater detail below.

FIGS. 3A-3B provide schematic illustrations of alternative exemplary physical layouts 300A and 300B (top views) of a SQUID portion 302 of a quantum circuit and a flux bias line structure with a single center conductor line forming two partial loops and terminating with a ground connection, according to some embodiments of the present disclosure. The physical layouts 300A and 300B as shown in FIGS. 3A and 3B, respectively, could be used in any of the quantum circuits employing flux bias lines, e.g. in any of the quantum circuits as described above with reference to FIGS. 1A-1C. For example, the SQUID portion 302 shown in FIG. 3A could e.g. be a portion of the transmon 128 shown in FIG. 1C, or other qubit. As shown in FIG. 3A, the SQUID portion 302 may include a SQUID 304 comprising two Josephson Junctions 306 (similar to FIG. 2, the Josephson Junctions 306 are shown as black squares, only one of which being labeled with a reference numeral in FIG. 3A in order to not clutter the drawing), connected by a superconducting loop 308. The SQUID 304 may be electrically connected to a capacitor 310, only a portion of which is shown in FIG. 3A (the electrical connection to the capacitor 310 is shown in FIG. 3A by the material with the pattern of the superconducting loop 308 extending to the capacitor 310).

FIG. 3A illustrates a flux bias line structure that includes a single center conductor line 312 originating from an external source, e.g. from a wirebonding pad or any other electrical connection to the die that houses the quantum circuit. As shown in FIG. 3A, the center conductor line 312 is a continuous line that curves to form two partial loops—one partial loop is labeled in FIG. 3A as a loop 314a (the loop with a cross symbol inside) and the other partial loop is labeled in FIG. 3B as a loop 314b (the loop with a dot symbol inside)—and terminating with a single ground connection 316. In various embodiments, similar to the ground connections 216a-b, the ground connection 316 may be any type of conductive contact connecting the center conductor line 312 to a ground potential that is different from that of a common ground plane 320, i.e. the ground connection 316 is electrically isolated from the common ground plane 320. Also similar to the ground connections 216a-b, in some embodiments, the ground connection 316 may be implemented as a connection to the ground in a package housing the quantum circuit 300A, e.g. via a solder bump or ball, or any other type of suitable electrical connection.

Current I flowing through the center conductor line 312 in the direction shown in FIG. 3A generates a magnetic field Ba with an average direction perpendicular to and pointing into the page of the drawing in the loop 314a and generates a magnetic field Bb with an average direction perpendicular to and pointing out the page of the drawing in the loop 314b, as labeled with a cross and a dot in the loops 314a and 314b, respectively.

For the embodiment shown in FIG. 3A, the SQUID 304 is provided near the loop 314a so that the magnetic field Ba extends to the SQUID 304 causing the current in the SQUID loop and generation of the magnetic field Bi inside the SQUID 304 in the direction that is perpendicular to and points out of the page of the drawing, as shown a dot inside the SQUID 304 in FIG. 3A. To that end, the SQUID 304 may be provided at a distance d from the loop 314a, the distance d indicated in FIG. 3A, that may be between about 100 nanometers (nm) and 15 micrometers (micron), including all values and ranges therein, e.g. between 5 and 15 micron or between 1 and 10 micron. The distance d would depend on the details of a particular implementation, such as e.g. materials used for the SQUID loop, substrate, flux bias line, current that would be provided in the flux bias line, etc.

In some embodiments, the two partial loops shown in FIG. 3A may be of comparable sizes, e.g. they may enclose areas which are substantially equal, so that the fields generated in these loops can adequately cancel out in the distance. In some embodiments, an area enclosed by each of the loops may be between about 10,000 $nm^2$ and 2500 $micron^2$, including all values and ranges therein, e.g. between 100 $micron^2$ and 1500 $micron^2$ or between 100 $micron^2$ and 900 $micron^2$. In some embodiments, a perimeter of each of the two partial loops 314a and 314b may be between about 600 nm and 250 micron, including all values and ranges therein, e.g. between 80 micron and 220 micron or between 100 micron and 200 micron. While the loops 314a and 314b are shown in FIG. 3A to enclose substantially square/rectangular areas, various embodiments these loops can take on any other suitable shapes, such as e.g. substantially circular, wavy, oval, or any free form loop shapes, as long as running currents through those loops would generate magnetic fields Ba and Bb as described herein.

FIG. 3B provides an illustration of the SQUID portion 302 and the flux bias line 312 as shown in FIG. 3A, except that now the SQUID loop 304 is provided near the loop 314b. As can be seen by comparison of FIGS. 3A and 3B, this would result in generation of the of magnetic field Bi inside the SQUID 304 in the direction that is perpendicular to and points into the page of the drawing, as shown a cross inside the SQUID 304 in FIG. 3B. Other discussions provided for FIG. 3A are applicable to FIG. 3B and, therefore, in the interests of brevity, are not repeated.

Figures 4A, 4B:
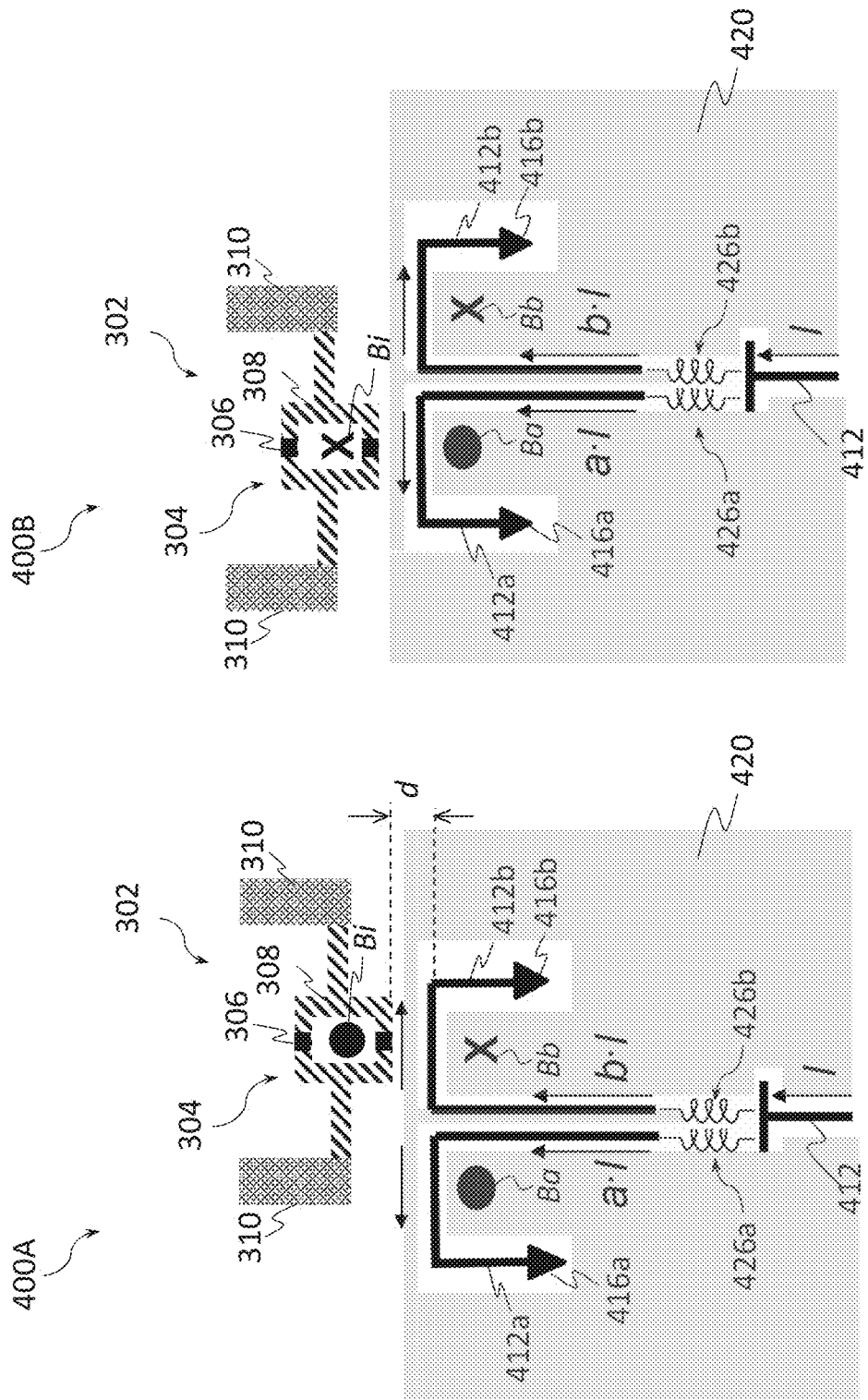
FIGS. 4A-4B provide schematic illustrations of exemplary physical layouts of a SQUID portion of a quantum circuit assembly and a flux bias line structure with a single center conductor line split into two center conductor lines each forming a partial loop and including an inductor, according to various embodiments of the present disclosure.

FIGS. 4A-4B provide schematic illustrations of alternative exemplary physical layouts 400A and 400B (top views) of a SQUID portion 302 of a quantum circuit and a flux bias line structure with a single center conductor line split into two center conductor lines each forming a partial loop and including an inductor, according to some embodiments of the present disclosure. The SQUID portion 302 of FIGS. 4A-4B is substantially the same as that shown in FIGS. 3A-3B and described above, which descriptions are not repeated here. Similar to the physical layouts of FIGS. 3A-3B, the physical layouts 400A and 400B as shown in FIGS. 4A-4B, respectively, could be used in any of the quantum circuits employing flux bias lines, e.g. in any of the quantum circuits as described above with reference to FIGS. 1A-1C.

FIG. 4A illustrates a flux bias line structure that includes a single center conductor line 412 originating from an external source, e.g. from a wirebonding pad or any other electrical connection to the die that houses the quantum circuit. As shown in FIG. 4A, the center conductor line 412 splits into two branches—center conductor lines 412a and 412b—each branch being curved to form a partial loop—the partial loop formed by the branch 412a is labeled in FIG. 4A as a loop 414a (the loop with a dot symbol inside) and the partial loop formed by the branch 412b is labeled in FIG. 4A as a loop 414b (the loop with a cross symbol inside). Each of the branches 412a and 412b terminates with a ground connection, shown in FIG. 4A as ground connections 416a and 416b, respectively, each of which could be a designated ground connection electrically isolated from a common ground plane 420, which common ground plane is similar to the common ground planes 220 and 320, described above. Discussions provided above for the ground connections 216a-b and 316 are applicable to the ground connections 416a and 416b and, therefore, in the interests of brevity, are not repeated.

As also shown in FIG. 4A, each of the branches 412a and 412b includes a respective inductor 426a and 426b. As used herein, an inductor refers to a passive two-terminal electrical component with as inductance of value L. The inductor could include the entire length of the line 412a/b, or a fraction of the line 412a/b, or be distributed along the line 412a/b. Preferably, the branches 412a and 412b have the same inductance, so that the current in one branch will be equal to the current in the other branch. In and alternating current (AC) field, kinetic inductance arises because electrons have mass, so it takes time for an electric field to accelerate them, and for an opposing field to change their direction. Kinetic inductance represents the inertia of electrons to change their direction when the direction of the electric field changes. With an alternating current of frequency co, a superconducting wire can be treated as two parallel conductors: one having the "normal" (i.e. not superconducting) electrons with a resistance R, and the other one with the superconducting electrons with a kinetic inductance $L_k$. When a superconductor is split into two current paths, the amount of current flowing in each path is determined by the kinetic inductance of each path, i.e. by the kinetic inductance of each of the branches 412a and 412b. The kinetic inductance increases with increasing magnetic penetration depth and wire length, and decreases with increasing cross-sectional wire area. By controlling the length, width, height, and magnetic penetration depth of the branches 412a and 412b, these branches may be designed to have a desired inductance, e.g. the same inductance. In some embodiments, the length of each of the branches 412a and 412b may be greater than about 100 microns, which is sufficiently large to ensure the current is split equally between the two paths (e.g. if the lengths of the two branches varied by about 500 nm, that would be an about 2.5% change in inductance for a 20-micron long line, but only an about 0.5% change for a 100-micron long line). Increasing the length increases the inductance, which may also help overcome variations in the ground potential (i.e. the effect of variations in ground potential is less noticeable).

In some embodiments, each of the inductors 426a and 426b may be implemented as an electrically conductive line, e.g. a wire (e.g. a portion of the respective split center conductor line 412a or 412b), of a given length and cross-sectional area. In other embodiments, each of the inductors 426a and 426b may be implemented as wires with higher and well-controlled kinetic inductance, by either increasing the length, decreasing the area, or inserting materials with higher magnetic penetration depths. For example the line width of the line implementing each of the inductors 426a and 426b may be between about 50 nm and 15 micron, including all values and ranges therein, e.g. between about 500 nm and 10 micron, or between about 500 nm to 1 micron. The thickness of the line implementing each of the inductors 426a and 426b could be between about 5 nm and 500 nm, including all values and ranges therein, e.g. between about 10 nm and 30 nm. The thickness of the line could be reduced by protecting the rest of the circuit with patterned photoresist, then applying a wet chemical etch or a dry plasma etch.

Current I flowing through the center conductor line 412 in the direction shown in FIG. 4A is split into two currents, a·I and b·I in the respective branches 412a and 412b, where values a and b indicate relative proportion of the total current/in a given branch (a and b are integers between 0 and 1, where a+b=1). The values of a and b depend on the kinetic inductance of the inductors 426a and 426b. The current a·I in the center conductor line branch 412a generates a magnetic field Ba with an average direction perpendicular to and pointing out of the page of the drawing in the loop 414a, as labeled with a dot in the loop 414a. The current b·I in the center conductor line branch 412b generates a magnetic field Bb with an average direction perpendicular to and pointing into the page of the drawing in the loop 414b, as labeled with a cross in the loop 414b.

For the embodiment shown in FIG. 4A, the SQUID 304 is provided near the loop 414b so that the magnetic field Bb extends to the SQUID 304 causing the current in the SQUID loop and generation of the magnetic field Bi inside the SQUID 304 in the direction that is perpendicular to and points out of the page of the drawing, shown as a dot inside the SQUID 304 in FIG. 4A. To that end, the SQUID 304 may be provided at a distance d from the loop 414b, as was described above with reference to FIG. 3A. Discussions provided above regarding geometry and sizes of the loops 314a and 314b shown in FIGS. 3A-3B are applicable to the loops 414a and 414b shown in FIGS. 4A-4B and, therefore, in the interests of brevity, are not repeated.

FIG. 4B provides an illustration of the SQUID portion 302 and the flux bias line 412 as shown in FIG. 4A, except that in FIG. 4B the SQUID loop 304 is provided near the loop 414a. As can be seen by comparison of FIGS. 4A and 4B, this would result in generation of the of magnetic field Bi inside the SQUID 304 in the direction that is perpendicular to and points into the page of the drawing, as shown a cross inside the SQUID 304 in FIG. 4B. Other discussions provided for FIG. 4A are applicable to FIG. 4B and, therefore, in the interests of brevity, are not repeated.

FIGS. 5A-5B provide schematic illustrations of alternative exemplary physical layouts 500A and 500B (top views) of a SQUID portion 302 of a quantum circuit and a flux bias line structure with two separately driven center conductor lines each forming a partial loop, according to some embodiments of the present disclosure. The SQUID portion 302 of FIGS. 5A-5B is substantially the same as that shown in FIGS. 3A-3B and described above, which descriptions are not repeated here. Similar to the physical layouts of FIGS. 3A-3B, the physical layouts 500A and 500B as shown in FIGS. 5A-5B, respectively, could be used in any of the quantum circuits employing flux bias lines, e.g. in any of the quantum circuits as described above with reference to FIGS. 1A-1C.

FIG. 5A illustrates a flux bias line structure that includes two separately driven center conductor lines—lines 512-1 and 512-2—originating from two respective external sources, e.g. from wirebonding pads or any other electrical connection to the die that houses the quantum circuit. As shown in FIG. 5A, the first center conductor line 512-1 curves to form a partial loop labeled in FIG. 5A as a loop 514a (the loop with a dot symbol inside), while the second center conductor line 512-2 curves to form a partial loop labeled in FIG. 5A as a loop 514b (the loop with a cross symbol inside). Each of the separate lines 512-1 and 512-2 terminates with a ground connection, shown in FIG. 5A as ground connections 516-1 and 516-1, respectively, each of which could be a designated ground connection electrically isolated from a common ground plane 520, which common ground plane is similar to the common ground planes 220 and 320, described above. Discussions provided above for the ground connections 216a-b and 316 are applicable to the ground connections 516a and 516b and, therefore, in the interests of brevity, are not repeated.

Currents $I_1$ and $I_2$ flowing through the center conductor lines 512-1 and 512-2, respectively, in the direction shown in FIG. 5A may be individually controlled to generate magnetic fields Ba and Bb of desired magnitude so that the desired Bi is generated while net magnetic filed at a desired distance is minimized (to reduce unwanted crosstalk). The current $I_1$ in the center conductor line 512-1 generates a magnetic field Ba with an average direction perpendicular to and pointing out of the page of the drawing in the loop 514a, as labeled with a dot in the loop 514a. The current $I_2$ in the center conductor line 512-2 generates a magnetic field Bb with an average direction perpendicular to and pointing into the page of the drawing in the loop 514b, as labeled with a cross in the loop 514b.

For the embodiment shown in FIG. 5A, the SQUID 304 is provided near the loop 514b so that the magnetic field Bb extends to the SQUID 304 causing the current in the SQUID loop and generation of the magnetic field Bi inside the SQUID 304 in the direction that is perpendicular to and points out of the page of the drawing, as shown a dot inside the SQUID 304 in FIG. 5A. To that end, the SQUID 304 may be provided at a distance d from the loop 514b, as was described above with reference to FIG. 3A. Discussions provided above regarding geometry and sizes of the loops 314a and 314b shown in FIGS. 3A-3B are applicable to the loops 514a and 514b shown in FIGS. 5A-5B and, therefore, in the interests of brevity, are not repeated.

FIG. 5B provides an illustration of the SQUID portion 302 and the flux bias line structure comprising two separately driven center conductor lines 512-1 and 512-2 as shown in FIG. 5A, except that in FIG. 5B the SQUID loop 304 is provided near the loop 514a. As can be seen by comparison of FIGS. 5A and B, this would result in generation of the of magnetic field Bi inside the SQUID 304 in the direction that is perpendicular to and points into the page of the drawing, as shown a cross inside the SQUID 304 in FIG. 5B. Other discussions provided for FIG. 5A are applicable to FIG. 5B and, therefore, in the interests of brevity, are not repeated.

Second Approach: Flux Bias Line Structures on Raised Portions

As briefly described above, the second approach to reducing crosstalk from the flux bias lines may include providing a SQUID and a portion of the flux bias line structure closest to the SQUID over a portion of a substrate that is elevated with respect to other portions of the substrate, i.e. on a raised portion. FIGS. 6-11 provide schematic illustrations of exemplary physical layouts of a SQUID portion of a quantum circuit assembly and a flux bias line structure with a raised portion, according to various embodiments of the present disclosure.

Figure 6:
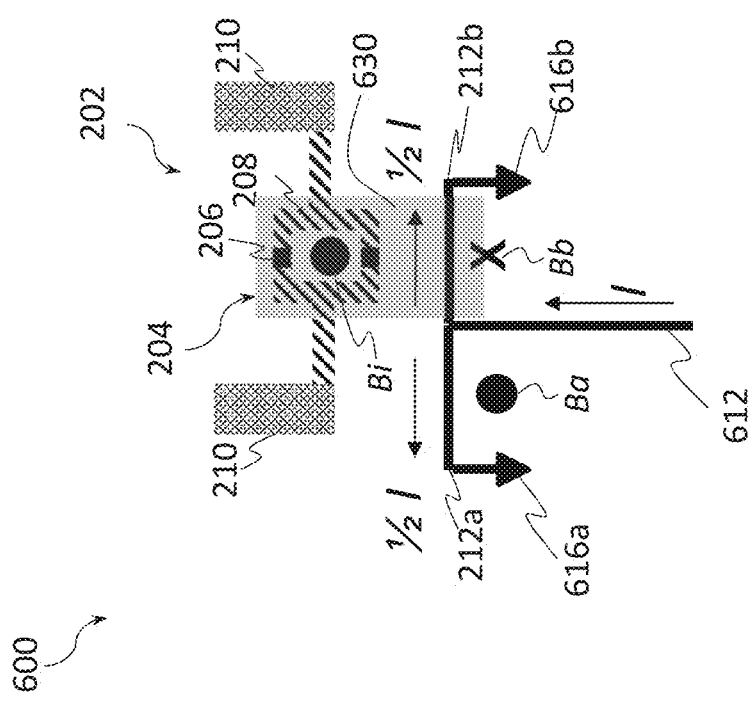
FIG. 6 provides a schematic illustration of an exemplary physical layout of a SQUID portion of a quantum circuit assembly and a flux bias line structure with a raised portion, according to one embodiment of the present disclosure.
Figure 7:
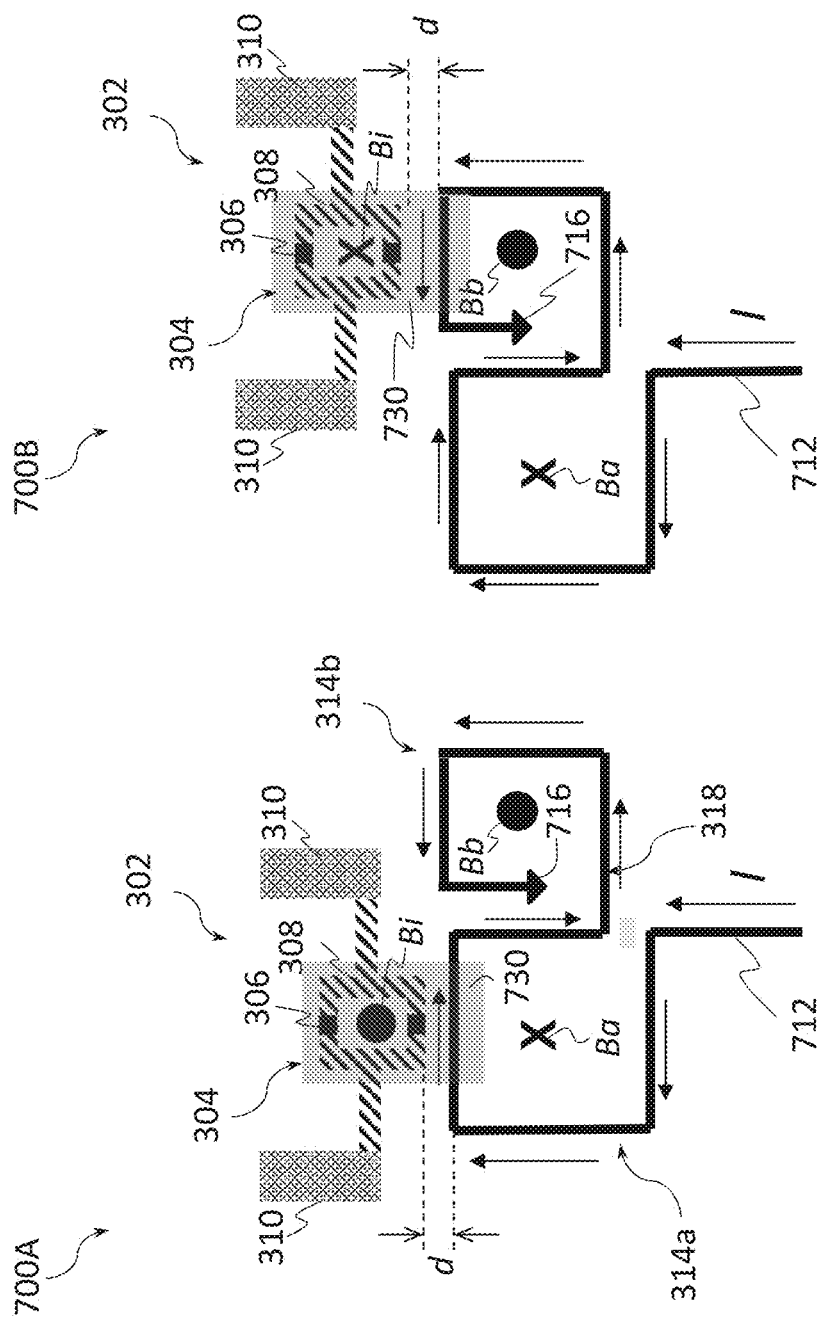
FIGS. 7A-7B provide schematic illustrations of exemplary physical layouts of a SQUID portion of a quantum circuit assembly and a flux bias line structure with a single center conductor line forming two partial loops and terminating with a ground connection, and with a raised portion, according to various embodiments of the present disclosure.
Figure 8:
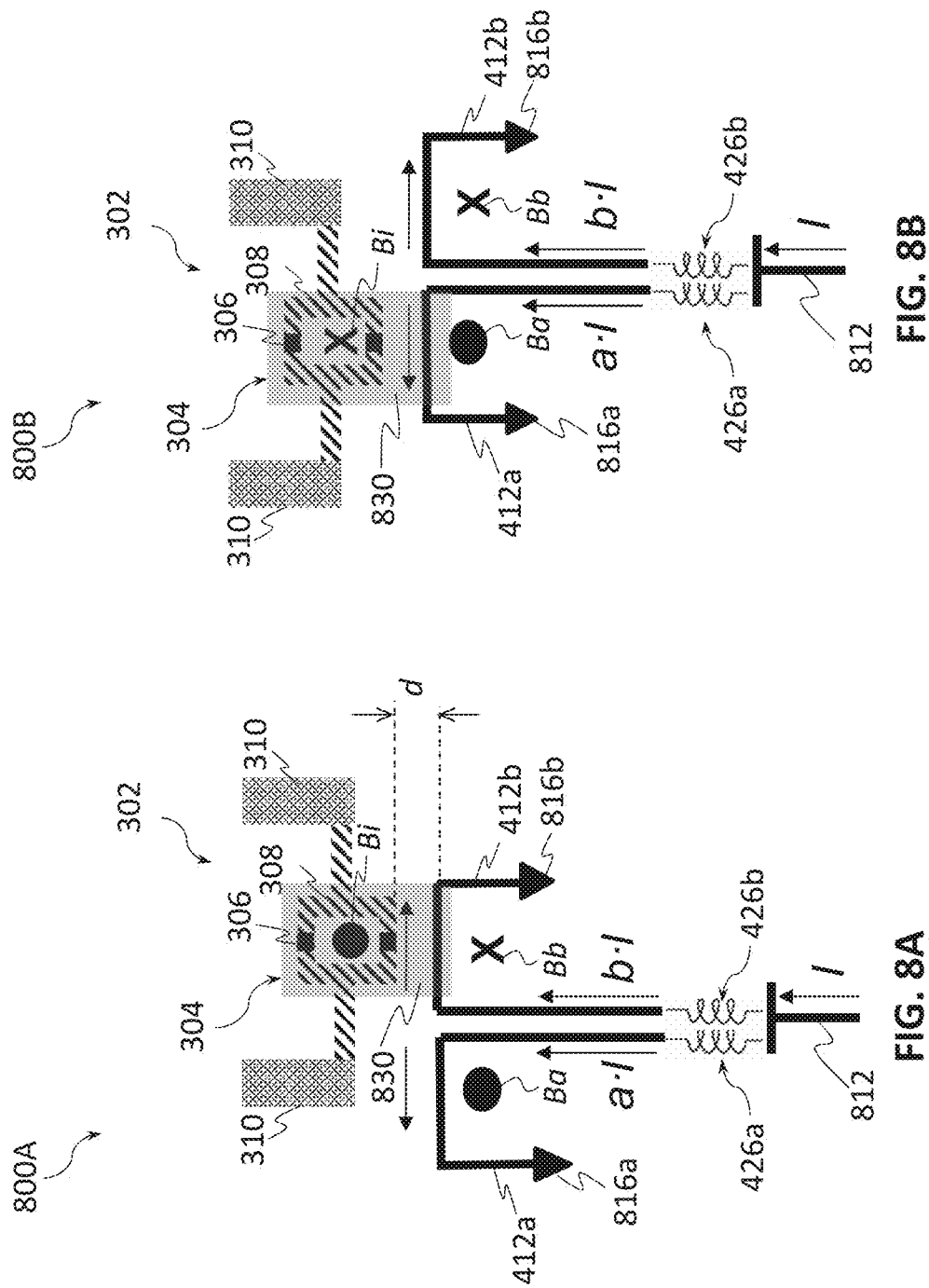
FIGS. 8A-8B provide schematic illustrations of exemplary physical layouts of a SQUID portion of a quantum circuit assembly and a flux bias line structure with a single center conductor line split into two center conductor lines each forming a partial loop and including an inductor, and with a raised portion, according to various embodiments of the present disclosure.
Figure 9:
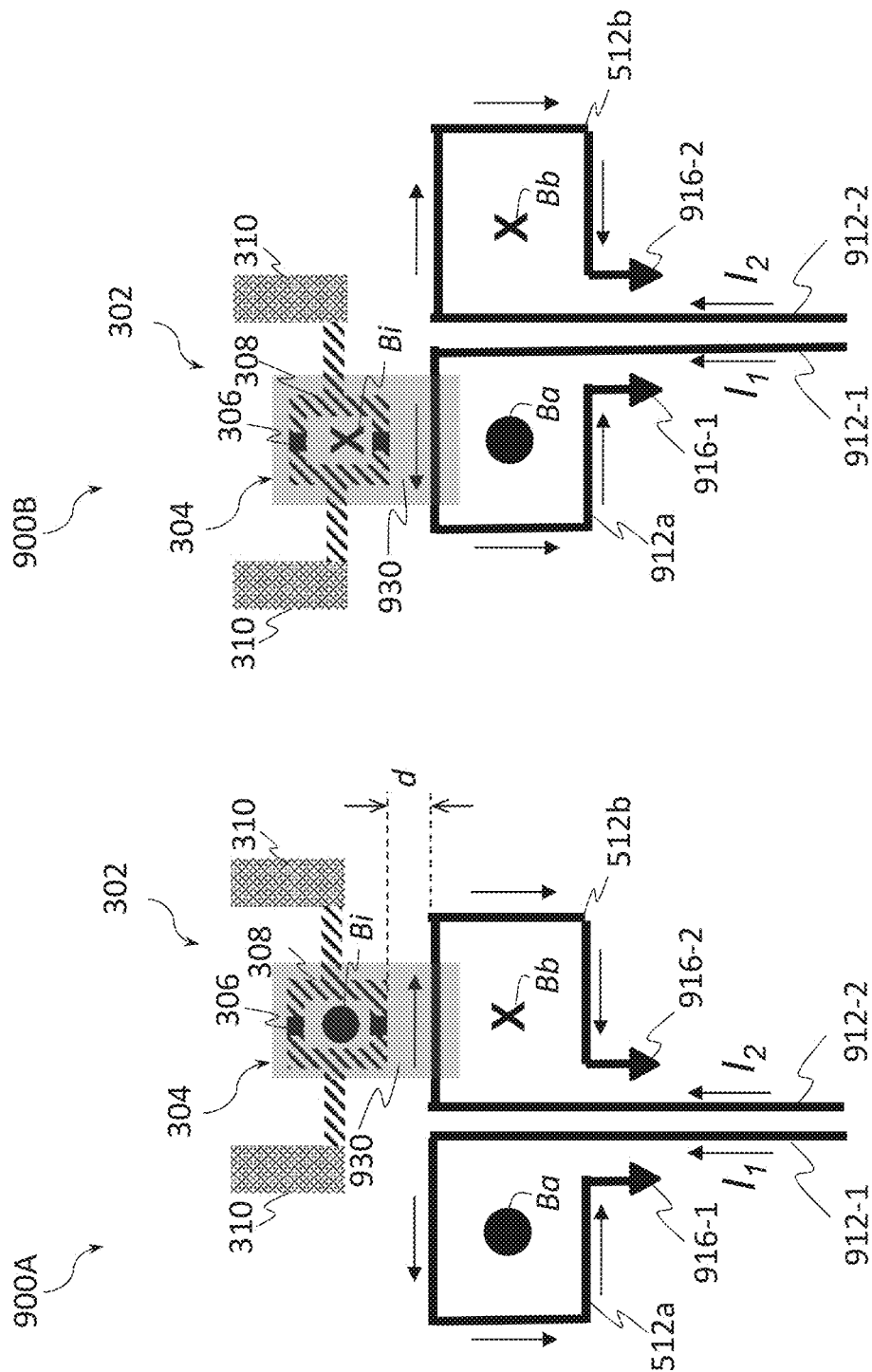
FIGS. 9A-9B provide schematic illustrations of exemplary physical layouts of a SQUID portion of a quantum circuit assembly and a flux bias line structure with two separately driven center conductor lines each forming a partial loop, and with a raised portion, according to various embodiments of the present disclosure.
Figure 10:
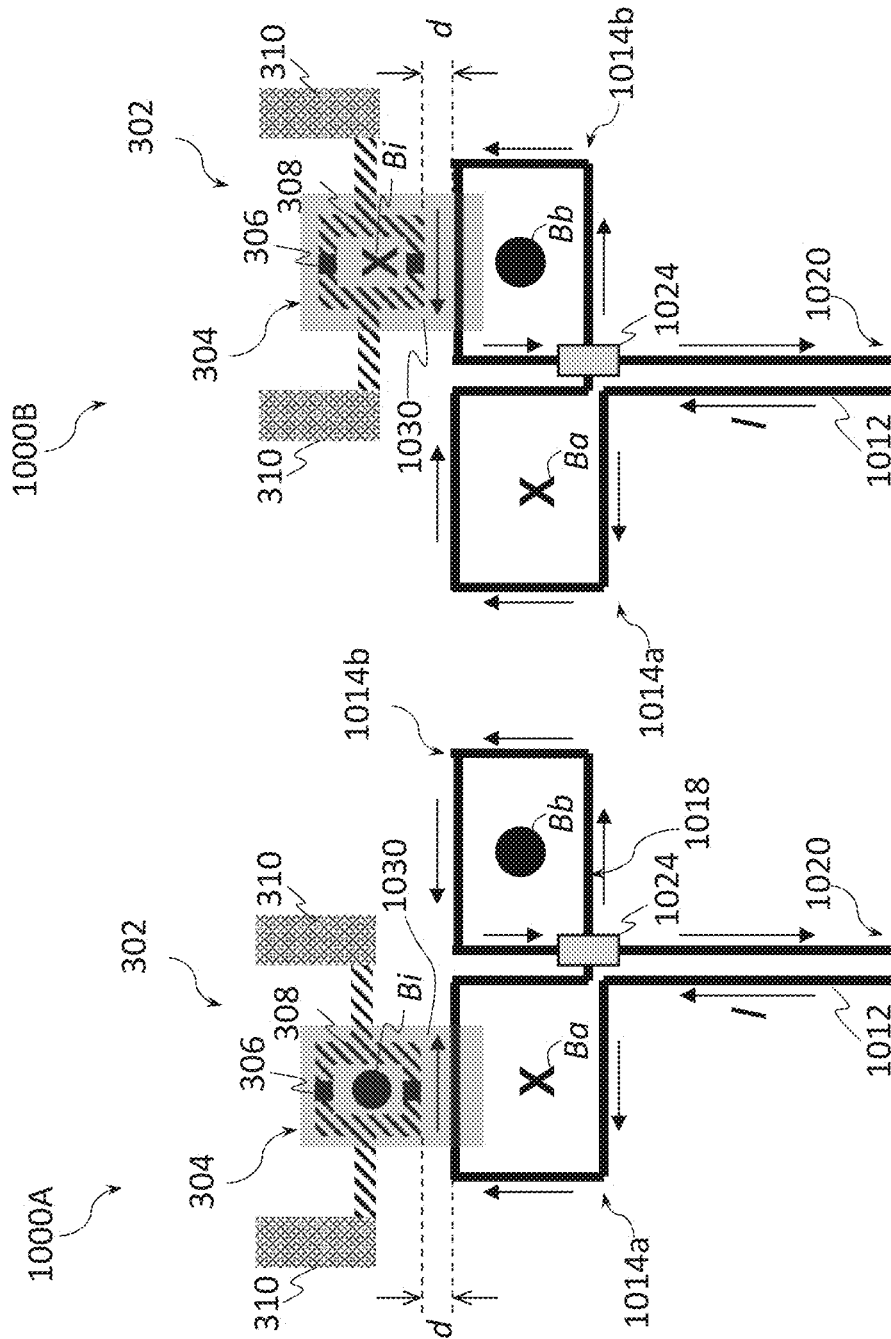
FIGS. 10A-10B provide schematic illustrations of exemplary physical layouts of a SQUID portion of a quantum circuit assembly and a flux bias line structure with a single center conductor line forming two partial loops and terminating with a signal connection, and with a raised portion, according to various embodiments of the present disclosure.
Figure 11:
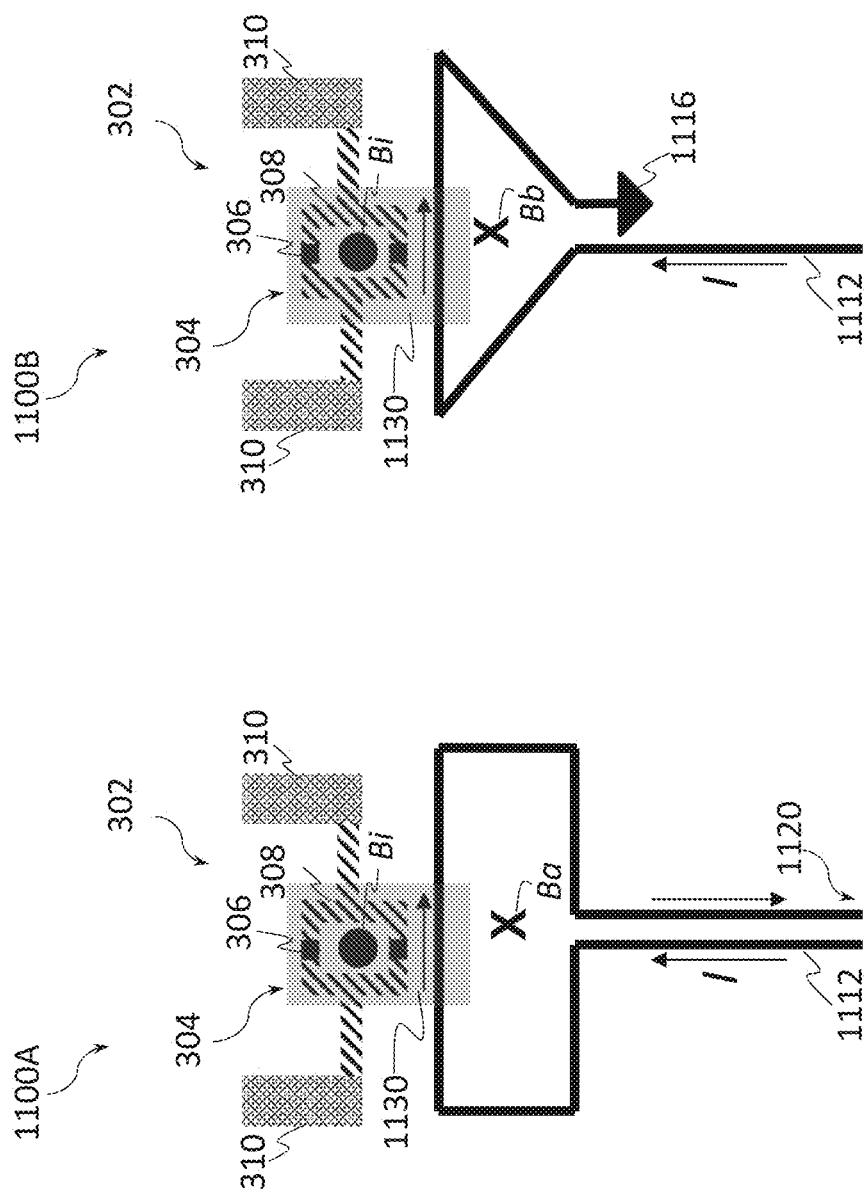
FIGS. 11A-11B provide schematic illustrations of exemplary physical layouts of a SQUID portion of a quantum circuit assembly and a flux bias line structure with a single center conductor line forming a single partial loop, and with a raised portion, according to various embodiments of the present disclosure.

FIG. 6 illustrates an exemplary physical layout 600 implementing an architecture of a flux bias line 612 similar to that shown in FIG. 2. In the interests of brevity, only the differences between these FIGS. are described, and the rest of the descriptions of FIG. 2 may be assumed to be applicable to FIG. 6 and, therefore, are not repeated. One difference is that the ground connections 616a and 616b do not have to be the designated ground connections electrically isolated from the common ground plane as shown in FIG. 2. That is why the common ground plane 220 is not specifically shown in FIG. 6. However, in some embodiments, the first and second approaches may be combined, in which case the ground connections 616a and 616b may be the designated ground connections 216a and 216b, electrically isolated from the common ground plane 220, as described with reference to FIG. 2. Another difference from the embodiment shown in FIG. 2 is that, in the embodiment shown in FIG. 6, the SQUID 204 and a portion of the flux bias line 612, together shown as an assembly 630 identified in FIG. 6 with a dark grey highlight, may be implemented on a raised portion of a substrate, i.e. may be provided in plane that is higher than, or is elevated compared to, the rest of the elements shown in FIG. 6. In some embodiments, the height of the raised portion 630, i.e. the distance from the rest of the qubit plane, e.g. the distance from the common ground plane of the quantum circuit assembly 600, may be between about 10 and 8000 nm, including all values and ranges therein, e.g. between about 100 and 3000 nm, or between about 200 and 2000 nm. Although not specifically illustrated in FIG. 6, in some embodiments, the ground connection 616b may also be provided on the raised portion 630. Such an embodiment may be particularly advantageous when the ground connection 616b is a designated ground connection similar to the connection 216b described with reference to FIG. 2. Although also not specifically illustrated in FIG. 6, in some embodiments, the ground connection 616a and the branch 212a, may also be provided on the raised portion 630. In some embodiments, the raised portion 630 may be electrically isolated from the common ground plane 220 that was described with reference to FIG. 2.

FIGS. 7A-7B illustrate exemplary physical layouts 700A and 700B implementing architectures of flux bias lines 712 similar to those shown in FIGS. 3A-3B. In the interests of brevity, only the differences between these FIGS. are described, and the rest of the descriptions of FIGS. 3A-3B may be assumed to be applicable to FIGS. 7A-7B and, therefore, are not repeated. One difference is that the ground connections 716 shown in FIGS. 7A-7B do not have to be the designated ground connections electrically isolated from the common ground plane as shown with the ground connections 316 of FIGS. 3A-3B. That is why the common ground plane 320 is not specifically shown in FIGS. 7A-7B. However, in some embodiments, the first and second approaches may be combined, in which case the ground connection 716 shown in FIGS. 7A-7B may be the designated ground connection 316 as shown in FIGS. 3A-3B, electrically isolated from the common ground plane 320, as described with reference to FIGS. 3A-3B. Another difference from the embodiments shown in FIGS. 3A-3B is that, in the embodiments shown in FIGS. 7A-7B, the SQUID 304 and a portion of the flux bias line 712, together shown as a portion 730 identified in FIGS. 7A-7B with a dark grey highlight, may be implemented on a raised portion of a substrate, i.e. may be provided in plane that is higher than the rest of the elements shown in FIGS. 7A-7B. In some embodiments, the height of the raised portion 730 may be similar to the height of the raised portion 630, described above. Although not specifically illustrated in FIG. 7B, in some embodiments, the ground connection 716 may also be provided on the raised portion 730. Such an embodiment may be particularly advantageous when the ground connection 716 is a designated ground connection similar to the connection 316 described with reference to FIG. 3B. Similarly, although also not specifically illustrated in FIG. 7A, in some embodiments, the ground connection 716 and the portion of the flux bias line generating the field Bb may also be provided on the raised portion 730. In some embodiments, the raised portion 730 may be electrically isolated from the common ground plane 320 that was described with reference to FIGS. 3A-3B.

FIGS. 8A-8B illustrate exemplary physical layouts 800A and 800B implementing architectures of flux bias lines 812 similar to those shown in FIGS. 4A-4B. In the interests of brevity, only the differences between these FIGS. are described, and the rest of the descriptions of FIGS. 4A-4B may be assumed to be applicable to FIGS. 8A-8B and, therefore, are not repeated. One difference is that the ground connections 816a and 816b shown in FIGS. 8A-8B do not have to be the designated ground connections electrically isolated from the common ground plane as shown with the ground connections 416a and 416b of FIGS. 4A-4B. That is why the common ground plane 420 is not specifically shown in FIGS. 8A-8B. However, in some embodiments, the first and second approaches may be combined, in which case the ground connections 816a-816b shown in FIGS. 8A-8B may be the designated ground connections 416a-416b as shown in FIGS. 4A-4B, electrically isolated from the common ground plane 420, as described with reference to FIGS. 4A-4B. Another difference from the embodiments shown in FIGS. 4A-4B is that, in the embodiments shown in FIGS. 8A-8B, the SQUID 304 and a portion of the flux bias line 812, together shown as a portion 830 identified in FIGS. 8A-8B with a dark grey highlight, may be implemented on a raised portion of a substrate, i.e. may be provided in plane that is higher than the rest of the elements shown in FIGS. 8A-8B. In some embodiments, the height of the raised portion 830 may be similar to the height of the raised portion 630, described above. Although not specifically illustrated in FIG. 8A, in some embodiments, the ground connection 816b may also be provided on the raised portion 830. Such an embodiment may be particularly advantageous when the ground connection 816b is a designated ground connection similar to the connection 416b described with reference to FIG. 4A. Similarly, although also not specifically illustrated in FIG. 8A, in some embodiments, the ground connection 816a and the portion of the flux bias line generating the field Ba may also be provided on the raised portion 830. Although not specifically illustrated in FIG. 8B, in some embodiments, the ground connection 816a may also be provided on the raised portion 830. Such an embodiment may be particularly advantageous when the ground connection 816a is a designated ground connection similar to the connection 416a described with reference to FIG. 4B. Similarly, although also not specifically illustrated in FIG. 8B, in some embodiments, the ground connection 816b and the portion of the flux bias line generating the field Bb may also be provided on the raised portion 830. In some embodiments, the raised portion 830 may be electrically isolated from the common ground plane 420 that was described with reference to FIGS. 4A-4B.

FIGS. 9A-9B illustrate exemplary physical layouts 900A and 900B implementing architectures of flux bias lines 912-1 and 912-2 similar to the flux bias lines 512-1 and 512-2 shown in FIGS. 5A-5B. In the interests of brevity, only the differences between these FIGS. are described, and the rest of the descriptions of FIGS. 5A-5B may be assumed to be applicable to FIGS. 9A-9B and, therefore, are not repeated. One difference is that the ground connections 916-1 and 916-2 shown in FIGS. 9A-9B do not have to be the designated ground connections electrically isolated from the common ground plane as shown with the ground connections 516-1 and 516-2 of FIGS. 5A-5B. That is why the common ground plane 520 is not specifically shown in FIGS. 9A-9B. However, in some embodiments, the first and second approaches may be combined, in which case the ground connections 916-1 and 916-2 shown in FIGS. 9A-9B may be the designated ground connections 516-1 and 516-2 as shown in FIGS. 5A-5B, electrically isolated from the common ground plane 520, as described with reference to FIGS. 5A-5B. Another difference from the embodiments shown in FIGS. 5A-5B is that, in the embodiments shown in FIGS. 9A-9B, the SQUID 304 and a portion of the flux bias lines 912, together shown as a portion 930 identified in FIGS. 9A-9B with a dark grey highlight, may be implemented on a raised portion of a substrate, i.e. may be provided in plane that is higher than the rest of the elements shown in FIGS. 9A-9B. In some embodiments, the height of the raised portion 930 may be similar to the height of the raised portion 630, described above. Although not specifically illustrated in FIG. 9A, in some embodiments, the ground connection 916-2 may also be provided on the raised portion 930. Such an embodiment may be particularly advantageous when the ground connection 916-2 is a designated ground connection similar to the connection 516-2 described with reference to FIG. 5A. Similarly, although also not specifically illustrated in FIG. 9A, in some embodiments, the ground connection 916-1 and the portion of the flux bias line generating the field Ba may also be provided on the raised portion 930. Although not specifically illustrated in FIG. 9B, in some embodiments, the ground connection 916-1 may also be provided on the raised portion 930. Such an embodiment may be particularly advantageous when the ground connection 916-1 is a designated ground connection similar to the connection 516-1 described with reference to FIG. 5B. Similarly, although also not specifically illustrated in FIG. 9B, in some embodiments, the ground connection 916-2 and the portion of the flux bias line generating the field Bb may also be provided on the raised portion 930. In some embodiments, the raised portion 930 may be electrically isolated from the common ground plane 520 that was described with reference to FIGS. 5A-5B.

FIGS. 10A-10B provide schematic illustrations of alternative exemplary physical layouts 1000A and 1000B (top views) of a SQUID portion 302 of a quantum circuit and a flux bias line structure with a single center conductor line 1012 forming two partial loops and terminating with a signal connection (i.e. having both one input and one output for the signal current flowing along the loops), according to some embodiments of the present disclosure. The SQUID portion 302 of FIGS. 10A-10B is substantially the same as that shown in FIGS. 3A-3B and described above, which descriptions are not repeated here. Similar to the physical layouts described above, the physical layouts 1000A and 1000B as shown in FIGS. 10A-10B, respectively, could be used in any of the quantum circuits employing flux bias lines, e.g. in any of the quantum circuits as described above with reference to FIGS. 1A-1C.

FIG. 10A illustrates a flux bias line structure that includes a single center conductor line 1012 originating from an external source, e.g. from a wirebonding pad or any other electrical connection to the die that houses the quantum circuit. As shown in FIG. 10A, the center conductor line 1012 may be a continuous line that curves to form two partial loops—one partial loop is labeled in FIG. 10A as a loop 1014a (the loop with a cross symbol inside) and the other partial loop is labeled in FIG. 10A as a loop 1014b (the loop with a dot symbol inside), similar to the center conductor line 312 shown in FIGS. 3A-3B. Unlike the center conductor line 312 which terminates with a ground connection, the center conductor line 1012 terminates with a signal connection 1020 (i.e. the connection 1020 is the output for the signal current flowing along the loops 1014a and 1014b). As shown in FIG. 10A, the center conductor line 1012 has to cross over a portion 1018 of itself, which could be implemented via e.g. an air bridge 1024, schematically illustrated in FIG. 10A. In other embodiments, the air bridge 1024 could be substituted by an electrical connection made under the surface.

Current I flowing through the center conductor line 1012 in the direction shown in FIG. 10A generates a magnetic field Ba with an average direction perpendicular to and pointing into the page of the drawing in the loop 1014a and generates a magnetic field Bb with an average direction perpendicular to and pointing out the page of the drawing in the loop 1014b, as labeled with a cross and a dot in the loops 1014a and 1014b, respectively.

For the embodiment shown in FIG. 10A, the SQUID 304 is provided near the loop 1014a so that the magnetic field Ba extends to the SQUID 304 causing the current in the SQUID loop and generation of the magnetic field Bi inside the SQUID 304 in the direction that is perpendicular to and points out of the page of the drawing, as shown a dot inside the SQUID 304 in FIG. 10A. To that end, the SQUID 304 may be provided at a distance d from the loop 1014a, as was described above with reference to FIG. 3A. Discussions provided above regarding geometry and sizes of the loops 314a and 314b shown in FIGS. 3A-3B are applicable to the loops 1014a and 1014b shown in FIGS. 10A-10B and, therefore, in the interests of brevity, are not repeated.

FIG. 10B provides an illustration of the SQUID portion 302 and the flux bias line 1012 as shown in FIG. 10A, except that in FIG. 10B the SQUID loop 304 is provided near the loop 1014b. As can be seen by comparison of FIGS. 10A and 10B, this would result in generation of the of magnetic field Bi inside the SQUID 304 in the direction that is perpendicular to and points into the page of the drawing, as shown a cross inside the SQUID 304 in FIG. 10B. Other discussions provided for FIG. 10A are applicable to FIG. 10B and, therefore, in the interests of brevity, are not repeated.

Applicable to both embodiments shown in FIGS. 10A-10B, the SQUID 304 and a portion of the flux bias line 1012, together shown as a portion 1030 identified in FIGS. 10A-10B with a dark grey highlight, may be implemented on a raised portion of a substrate, i.e. may be provided in plane that is higher than the rest of the elements shown in FIGS. 10A-10B. In some embodiments, the height of the raised portion 1030 may be similar to the height of the raised portion 630, described above. Although not specifically illustrated in FIG. 10A, in some embodiments, at least a part of the portion of the flux bias line generating the field Bb may also be provided on the raised portion 1030. Similarly, although not specifically illustrated in FIG. 10B, in some embodiments, at least a part of the portion of the flux bias line generating the field Ba may also be provided on the raised portion 1030. In some embodiments, the raised portion 1030 may be electrically isolated from a common ground plane as described above (the common ground plane not specifically shown in FIGS. 10A-10B in order to not clutter the drawings).

FIGS. 11A-11B provide schematic illustrations of alternative exemplary physical layouts 1100A and 1100B (top views) of a SQUID portion 302 of a quantum circuit and a flux bias line structure with a single center conductor line forming a single partial loop, according to some embodiments of the present disclosure. The SQUID portion 302 of FIGS. 11A-11B is substantially the same as that shown in FIGS. 3A-3B and described above, which descriptions are not repeated here. Similar to the physical layouts described above, the physical layouts 1100A and 1100B as shown in FIGS. 11A-11B, respectively, could be used in any of the quantum circuits employing flux bias lines, e.g. in any of the quantum circuits as described above with reference to FIGS. 1A-1C.

FIG. 11A illustrates a flux bias line structure that includes a single center conductor line 1112 originating from an external source, e.g. from a wirebonding pad or any other electrical connection to the die that houses the quantum circuit. As shown in FIG. 11A, the center conductor line 1112 is a continuous line that curves to form a single loop labeled in FIG. 11A as a loop 1114 (the loop with a cross symbol inside). The center conductor line 1112 terminates with a signal connection 1120, similar to the signal connection 1020 described above.

Current I flowing through the center conductor line 1112 in the direction shown in FIG. 11A generates a magnetic field Ba with an average direction perpendicular to and pointing into the page of the drawing in the loop 1114, labeled with a cross. The SQUID 304 is provided near the loop 1114 so that the magnetic field Ba extends to the SQUID 304 causing the current in the SQUID loop and generation of the magnetic field Bi inside the SQUID 304 in the direction that is perpendicular to and points out of the page of the drawing, as shown a dot inside the SQUID 304 in FIG. 11A. To that end, the SQUID 304 may be provided at a distance d from the loop 1114, as was described above with reference to FIG. 3A. Discussions provided above regarding geometry and sizes of the loops 314a and 314b shown in FIGS. 3A-3B are applicable to the loop 1114 shown in FIG. 11A and, therefore, in the interests of brevity, are not repeated. Because in this implementation there is no second partial loop with an opposite magnetic field, in principle magnetic field Ba could potentially negatively affect other circuit components in the vicinity of the loop 1114. However, that effect can be mitigated by various means for electromagnetic interference protection as known in the art and the embodiment shown in FIG. 11A may still be advantageous due to its simplicity compared to the two-loop embodiments.

FIG. 11B provides an illustration of the SQUID portion 302 and the flux bias line 1112 as shown in FIG. 11A, except that FIG. 11B illustrates an example of the flux bias line 1112 being shaped differently (triangle vs. rectangle) and also illustrates that the flux bias line 1112 may, alternatively, be terminated with a ground connection 1116 instead of the signal connection 1120 as shown in FIG. 11A. The ground connection 1116 may be implemented similar to the ground connection 316, described above. In some embodiments, the ground connection 1116 may be a designated ground connection electrically isolated from a common ground plane as described above.

Applicable to both embodiments shown in FIGS. 11A-11B, the SQUID 304 and a portion of the flux bias line 1112, together shown as a portion 1130 identified in FIGS. 11A-11B with a dark grey highlight, may be implemented on a raised portion of a substrate, i.e. may be provided in plane that is higher than the rest of the elements shown in FIGS. 11A-11B. In some embodiments, the height of the raised portion 1130 may be similar to the height of the raised portion 630, described above. In some embodiments, the raised portion 1130 may be electrically isolated from a common ground plane as described above (the common ground plane not specifically shown in FIGS. 11A-11B in order to not clutter the drawings). Although not specifically illustrated in FIG. 11B, in some embodiments, the ground connection 1116 may be a designated ground connection as described above and the raised portion 1130 may but does not have to be implemented.

What is common to all of the flux bias line structures described above is that a desired amount of current may be carefully controlled in the loop provided in the vicinity of a SQUID so that the magnetic field strength generated in the SQUID can be well-defined and, consequently, frequency of a qubit can be carefully tuned. The flux bias line structures described herein further allow controlling the current path as to reduce undesired, and unknown, magnetic fields. The embodiments with two partial loops may provide the advantage of effectively diminishing the magnitude of the magnetic field generated by the flux bias line away from the SQUID so that it does not affect other components of the circuit (for example, if the magnetic field extends to a neighboring qubit, the frequency of that neighboring qubit could be affected). Therefore, compared to conventional implementations, at least some of the flux bias line structures described herein may allow to generate precise local magnetic field to control SQUID frequency based on the absolute current magnitude and coils(s) geometry and not on other, poorly controllable, parameters such as e.g. non-ideal ground impedance, while still preserving magnetic field cancellation at farther distances to minimize unwanted crosstalk to other quantum circuits. On the other hand, the embodiments with a single partial loop may provide the advantage of simpler fabrication. In various embodiments, the currents provided in the center line conductors described herein to generate magnetic fields which are used to tune (change) the qubit frequency may be low frequency pulses, e.g. with a frequency lower than 1 GHz.

Exemplary Packages and Devices

In various embodiments, quantum circuits with flux bias line structures as described herein may be included within a package. FIG. 12 provides a schematic illustration of an exemplary superconducting (SC) qubit device package coupling a die with a superconducting qubit device with any of the flux bias line arrangements described herein to a package substrate, according to some embodiments of the present disclosure.

FIG. 12 illustrates a SC qubit device package 140 in which a SC quantum circuit 100 is included in a die 142, and the die 142 is coupled to a package substrate 144. The SC quantum circuit 100 may be any of the quantum circuits as described above with reference to FIGS. 1A-1C and may include SQUID(s) and flux bias line(s) in one or more of the physical layouts described above.

A number of elements referred in the description of FIG. 12 with reference numerals are indicated in FIG. 12 with different patterns, with a legend showing the correspondence between the reference numerals and patterns being provided at the bottom of FIG. 12, and are not labeled in FIG. 12 with arrows pointing to them in order to not clutter the drawing. For example, the legend illustrates that FIG. 12 uses different patterns to show the die 142, the conductive contacts 150, 158, and 160, etc.

The die 142 may include a first face 146 and an opposing second face 148. The qubits 102 and the resonators 116/118 may be proximate to or provided on the first face 146, and conductive pathways may extend and be coupled between these elements and the conductive contacts 120, 122, and 126 also disposed at the first face 146. An exemplary plurality of the conductive contacts 120, 122, and 126 disposed at the first face 146 of the SC qubit die 142 are shown in FIG. 12 as conductive contacts 150. The conductive pathways are not specifically shown in FIG. 12 because the details of the SC quantum circuit 100 are not specifically shown in FIG. 12. In some embodiments, such conductive pathways, in particular flux bias lines as described herein, are also disposed on the first face 146 of the die 142. In various embodiments, the conductive contacts 150 may be formed of any suitable conductive material (e.g., a superconducting material). The conductive contacts 150 may take form of solder bond pads, but other first level interconnect structures may be used (e.g., conductive epoxies, anisotropic conductive films, copper to copper bonding posts, etc.) to route electrical signals to/from the die 142.

The package substrate 144 may include a first face 152 and an opposing second face 154. Conductive contacts 158 may, optionally, be disposed at the first face 152, and conductive contacts 160 may be disposed at the second face 154. Conductive pathways 162 may extend through an insulating material 164 of the package substrate 144 between the first face 152 and the second face 154 of the package substrate 144, electrically coupling various ones of the conductive contacts 158 to various ones of the conductive contacts 160, in any desired manner. The insulating material 164 may be a dielectric material (e.g., an ILD), and may take the form of any of the embodiments of the insulating materials disclosed herein, for example. The conductive pathways 162 may include one or more conductive vias, one or more conductive lines, or a combination of conductive vias and conductive lines, for example.

In some embodiments, the package substrate 144 may be or may otherwise include a silicon interposer, and the conductive pathways 162 may be through-silicon vias. Silicon may have a desirably low coefficient of thermal expansion compared with other dielectric materials that may be used for the insulating material 164, and thus may limit the degree to which the package substrate 144 expands and contracts during temperature changes relative to such other materials (e.g., polymers having higher coefficients of thermal expansion). A silicon interposer may also help the package substrate 144 achieve a desirably small line width and maintain high connection density to the die 142.

In some embodiments, the insulating material 164 of the package substrate 144 may be selected to be the same as the insulating material of the SC qubit die 142. In one implementation, the die 142 and the package substrate 144 may be a crystalline substrate such as, but not limited to a silicon or a sapphire substrate, and may be provided as a wafer or a portion thereof. In other implementations, the substrate may be non-crystalline. In general, any material that provides sufficient advantages (e.g. sufficiently good electrical isolation and/or ability to apply known fabrication and processing techniques) to outweigh the possible disadvantages (e.g. negative effects of various defects), and that may serve as a foundation upon which a quantum circuit may be built, falls within the spirit and scope of the present disclosure. Additional examples of substrates include silicon-on-insulator (SOI) substrates, III-V substrates, and quartz substrates.

The conductive contacts 150 of the die 142 may be electrically coupled to the conductive contacts 160 of the package substrate 144 via first level interconnects 166. In some embodiments, the first level interconnects 166 may include solder bumps or balls, as illustrated in FIG. 12 by showing in FIG. 12 the first level interconnects 166 as white circles associated with the conductive contacts 160. In some embodiments, the first level interconnects 166 may be flip chip (or controlled collapse chip connection, C4) bumps disposed initially on the die 142 or on the package substrate 144. Second level interconnects 168 (e.g., solder balls or other types of interconnects) may couple the conductive contacts 158 on the first face 152 of the package substrate 144 to another component, such as a circuit board (not specifically shown in FIG. 12). Examples of arrangements of electronics packages that may include an embodiment of the SC qubit device package 140 are discussed below with reference to FIG. 14. The die 142 may be brought in contact with the package substrate 144 using a pick-and-place apparatus, for example, and a reflow or thermal compression bonding operation may be used to couple the die 142 to the package substrate 144 via the first level interconnects 166.

In some embodiments, the surface of the die around the contacts 150 may be coated with a material which is not wetted by the solder material 166. This material is generally known as a solder mask and can take any appropriate form, such as silicon nitride, aluminum oxide, and silicon oxide. The presence of this solder mask material enables solder mask defined contacts.

A solder resist material may be disposed around the conductive contacts 158 (not specifically shown in FIG. 12). The solder resist material may be a polyimide or similar material, or may be any appropriate type of packaging solder resist material. In some embodiments, the solder resist material may be a liquid or dry film material including photoimageable polymers. In some embodiments, the solder resist material may be non-photoimageable.

In various embodiments, more or fewer structures may be included in the conductive pathways and conductive contacts described with reference to FIG. 12. In some embodiments, conductive lines of the die 142 and the package substrate 144 may extend into and out of the plane of the drawing, providing conductive pathways to route electrical signals to and/or from various elements in the die 142.

As noted above, interconnect structures may be arranged within the SC quantum circuit 100 and in the package substrate 144 to route electrical signals according to a wide variety of designs (in particular, the arrangement is not limited to the particular configuration of interconnect structures depicted in FIG. 12 or any of the other accompanying figures, and may include more or fewer interconnect structures). During operation of the SC quantum circuit 100, electrical signals (such as e.g. power, input/output (I/O) signals, including various control signals for external and internal control of the qubits 102) may be routed to and/or from the qubits 102 of the SC quantum circuit 100 through the interconnects provided by the conductive contacts and conductive pathways of the die 142 and the package substrate 144. When at least one flux bias line according to the first approach as described herein is implemented in the package 140, at least some of the conductive contacts and conductive pathways of the die 142 and the package substrate 144 may be used to provide a designated ground connection for such a flux bias line.

In various embodiments, quantum circuits with flux bias line structures as described above may be fabricated using any suitable fabrication techniques.

Figure 13B:
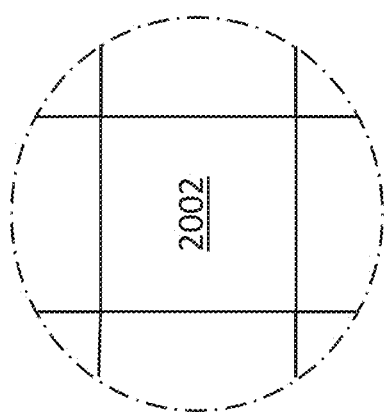
FIGS. 13A-13B are top views of a wafer and dies that may include one or more quantum circuit assemblies with flux bias line structures disclosed herein.
Figure 13A:
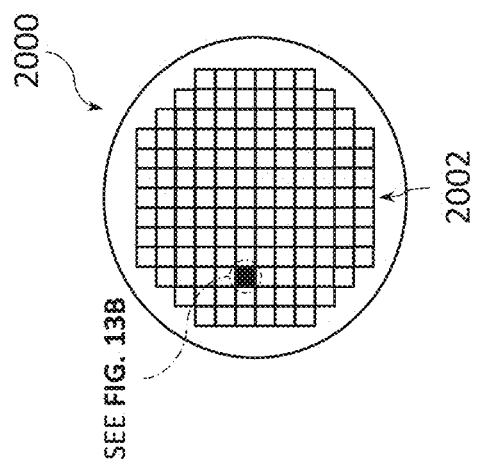

FIGS. 13A-13B are top views of a wafer 2000 and dies 2002 that may be formed from the wafer 2000, according to some embodiments of the present disclosure. The dies 2002 may include any of the quantum circuits/devices disclosed herein, e.g., the quantum circuit 100, and may include any of the flux bias line structures described herein, such as e.g. the flux bias line structures shown in FIGS. 2-11, or any combinations of these flux bias line structures. The wafer 2000 may include semiconductor material and may include one or more dies 2002 having conventional and quantum circuit device elements formed on a surface of the wafer 2000. Each of the dies 2002 may be a repeating unit of a semiconductor product that includes any suitable conventional and/or quantum circuit qubit device. After the fabrication of the semiconductor product is complete, the wafer 2000 may undergo a singulation process in which each of the dies 2002 is separated from one another to provide discrete "chips" of the semiconductor product. A die 2002 may include one or more quantum circuits 100 and/or supporting circuitry to route electrical signals to the quantum circuits 100 (e.g., interconnects connected to the conductive contacts of the flux bias line structures described herein, and other conductive vias and lines), as well as any other IC components. In some embodiments, the wafer 2000 or the die 2002 may include a memory device (e.g., a static random access memory (SRAM) device), a logic device (e.g., AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2202 of FIG. 15) or other logic that is configured to store information in the memory devices or execute instructions stored in the memory array.

Figure 14:
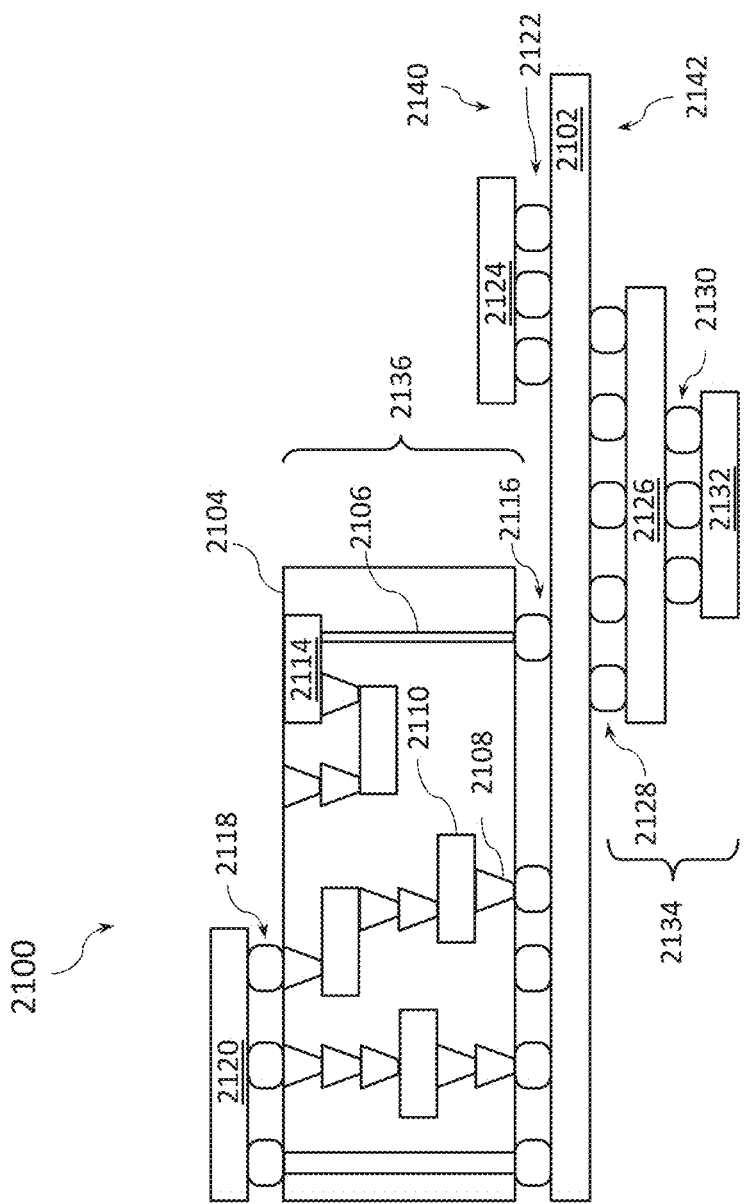
FIG. 14 is a cross-sectional side view of a device assembly that may include one or more of quantum circuit assemblies with flux bias line structures disclosed herein.

FIG. 14 is a cross-sectional side view of a device assembly 2100 that may include any of the embodiments of the quantum circuits employing flux bias line structures disclosed herein. The device assembly 2100 includes a number of components disposed on a circuit board 2102. The device assembly 2100 may include components disposed on a first face 2140 of the circuit board 2102 and an opposing second face 2142 of the circuit board 2102; generally, components may be disposed on one or both faces 2140 and 2142.

In some embodiments, the circuit board 2102 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2102. In other embodiments, the circuit board 2102 may be a package substrate or flexible board.

The IC device assembly 2100 illustrated in FIG. 14 includes a package-on-interposer structure 2136 coupled to the first face 2140 of the circuit board 2102 by coupling components 2116. The coupling components 2116 may electrically and mechanically couple the package-on-interposer structure 2136 to the circuit board 2102, and may include solder balls (as illustrated in the example of FIG. 14), male and female portions of a socket, an adhesive, an underfill material, and/or any other suitable electrical and/or mechanical coupling structure.

The package-on-interposer structure 2136 may include a package 2120 coupled to an interposer 2104 by coupling components 2118. The coupling components 2118 may take any suitable form for the application, such as the forms discussed above with reference to the coupling components 2116. Although a single package 2120 is shown in FIG. 14, multiple packages may be coupled to the interposer 2104; indeed, additional interposers may be coupled to the interposer 2104. The interposer 2104 may provide an intervening substrate used to bridge the circuit board 2102 and the package 2120. The package 2120 may be a quantum circuit device package as described herein, e.g. a package including the quantum circuit 100 with any of the flux bias line structures described herein, or a combination thereof, or may be a conventional IC package, for example. Generally, the interposer 2104 may spread a connection to a wider pitch or reroute a connection to a different connection. For example, the interposer 2104 may couple the package 2120 (e.g., a die) to a ball grid array (BGA) of the coupling components 2116 for coupling to the circuit board 2102. In the embodiment illustrated in FIG. 14, the package 2120 and the circuit board 2102 are attached to opposing sides of the interposer 2104; in other embodiments, the package 2120 and the circuit board 2102 may be attached to a same side of the interposer 2104. In some embodiments, three or more components may be interconnected by way of the interposer 2104.

The interposer 2104 may be formed of an epoxy resin, a fiberglass-reinforced epoxy resin, a ceramic material, or a polymer material such as polyimide. In some embodiments, the interposer 2104 may be formed of alternate rigid or flexible materials that may include the same materials described above for use in a semiconductor substrate, such as silicon, germanium, and other group III-V and group IV materials. The interposer 2104 may include metal interconnects 2108 and vias 2110, including but not limited to through-silicon vias (TSVs) 2106. The interposer 2104 may further include embedded devices 2114, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 2104. The package-on-interposer structure 2136 may take the form of any of the package-on-interposer structures known in the art.

The device assembly 2100 may include a package 2124 coupled to the first face 2140 of the circuit board 2102 by coupling components 2122. The coupling components 2122 may take the form of any of the embodiments discussed above with reference to the coupling components 2116, and the package 2124 may take the form of any of the embodiments discussed above with reference to the package 2120. The package 2124 may be a package including one or more quantum circuits with qubits as described herein or may be a conventional IC package, for example. In some embodiments, the package 2124 may take the form of any of the embodiments of the quantum circuit 100 with any of the flux bias line structures described herein.

The device assembly 2100 illustrated in FIG. 14 includes a package-on-package structure 2134 coupled to the second face 2142 of the circuit board 2102 by coupling components 2128. The package-on-package structure 2134 may include a package 2126 and a package 2132 coupled together by coupling components 2130 such that the package 2126 is disposed between the circuit board 2102 and the package 2132. The coupling components 2128 and 2130 may take the form of any of the embodiments of the coupling components 2116 discussed above, and the packages 2126 and 2132 may take the form of any of the embodiments of the package 2120 discussed above. Each of the packages 2126 and 2132 may be a qubit device package as described herein or may be a conventional IC package, for example. In some embodiments, one or both of the packages 2126 and 2132 may take the form of any of the embodiments of the quantum circuit 100 with any of the flux bias line structures described herein, or a combination thereof.

Figure 15:
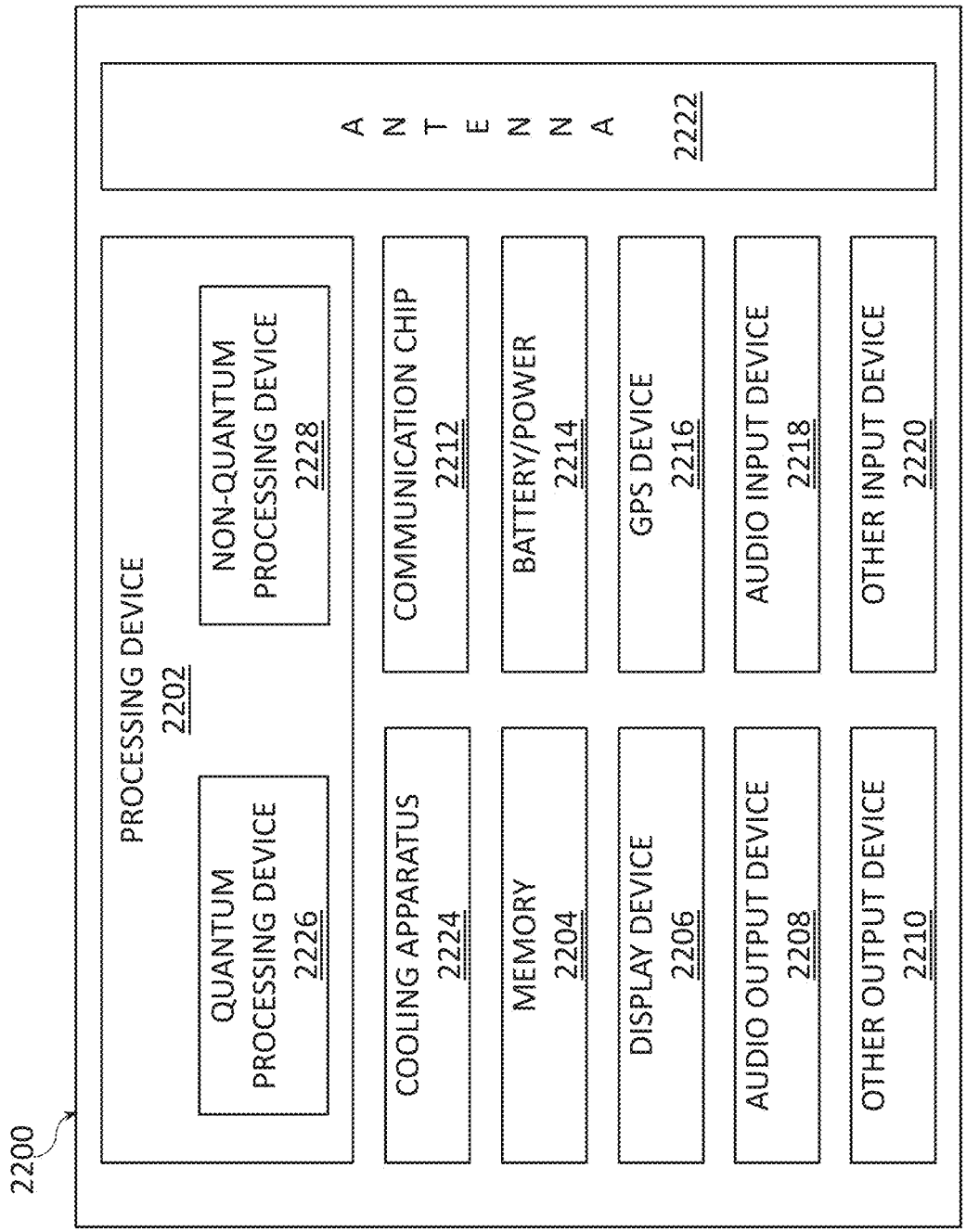
FIG. 15 is a block diagram of an example quantum computing device that may include one or more of quantum circuit assemblies with flux bias line structures disclosed herein, in accordance with various embodiments.

FIG. 15 is a block diagram of an example quantum computing device 2200 that may include any of the quantum circuits with flux bias line structures disclosed herein. A number of components are illustrated in FIG. 15 as included in the quantum computing device 2200, but any one or more of these components may be omitted or duplicated, as suitable for the application. In some embodiments, some or all of the components included in the quantum computing device 2200 may be attached to one or more PCBs (e.g., a motherboard), and may be included in, or include, any of the quantum circuits with flux bias line structures described herein. In some embodiments, various ones of these components may be fabricated onto a single system-on-a-chip (SoC) die. Additionally, in various embodiments, the quantum computing device 2200 may not include one or more of the components illustrated in FIG. 15, but the quantum computing device 2200 may include interface circuitry for coupling to the one or more components. For example, the quantum computing device 2200 may not include a display device 2206, but may include display device interface circuitry (e.g., a connector and driver circuitry) to which a display device 2206 may be coupled. In another set of examples, the quantum computing device 2200 may not include an audio input device 2218 or an audio output device 2208, but may include audio input or output device interface circuitry (e.g., connectors and supporting circuitry) to which an audio input device 2218 or audio output device 2208 may be coupled.

The quantum computing device 2200 may include a processing device 2202 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2202 may include a quantum processing device 2226 (e.g., one or more quantum processing devices), and a non-quantum processing device 2228 (e.g., one or more non-quantum processing devices). The quantum processing device 2226 may include one or more of the quantum circuits 100 with flux bias line structures disclosed herein, and may perform data processing by performing operations on the qubits that may be generated in the quantum circuits 100, and monitoring the result of those operations. For example, as discussed above, different qubits may be allowed to interact, the quantum states of different qubits may be set or transformed, and the quantum states of different qubits may be read. The quantum processing device 2226 may be a universal quantum processor, or specialized quantum processor configured to run one or more particular quantum algorithms. In some embodiments, the quantum processing device 2226 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2226 may also include support circuitry to support the processing capability of the quantum processing device 2226, such as input/output channels, multiplexers, signal mixers, quantum amplifiers, and analog-to-digital converters.

As noted above, the processing device 2202 may include a non-quantum processing device 2228. In some embodiments, the non-quantum processing device 2228 may provide peripheral logic to support the operation of the quantum processing device 2226. For example, the non-quantum processing device 2228 may control the performance of a read operation, control the performance of a write operation, control the clearing of quantum bits, etc. The non-quantum processing device 2228 may also perform conventional computing functions to supplement the computing functions provided by the quantum processing device 2226. For example, the non-quantum processing device 2228 may interface with one or more of the other components of the quantum computing device 2200 (e.g., the communication chip 2212 discussed below, the display device 2206 discussed below, etc.) in a conventional manner, and may serve as an interface between the quantum processing device 2226 and conventional components. The non-quantum processing device 2228 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2200 may include a memory 2204, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the states of qubits in the quantum processing device 2226 may be read and stored in the memory 2204. In some embodiments, the memory 2204 may include memory that shares a die with the non-quantum processing device 2228. This memory may be used as cache memory and may include embedded dynamic random access memory (eDRAM) or spin transfer torque magnetic random access memory (STT-MRAM).

The quantum computing device 2200 may include a cooling apparatus 2224. The cooling apparatus 2224 may maintain the quantum processing device 2226, in particular the quantum circuits 100 as described herein, at a predetermined low temperature during operation to avoid qubit decoherence and to reduce the effects of scattering in the quantum processing device 2226. This predetermined low temperature may vary depending on the setting; in some embodiments, the temperature may be 5 degrees Kelvin or less. In some embodiments, the non-quantum processing device 2228 (and various other components of the quantum computing device 2200) may not be cooled by the cooling apparatus 2224, and may instead operate at room temperature. The cooling apparatus 2224 may be, for example, a dilution refrigerator, a helium-3 refrigerator, or a liquid helium refrigerator.

In some embodiments, the quantum computing device 2200 may include a communication chip 2212 (e.g., one or more communication chips). For example, the communication chip 2212 may be configured for managing wireless communications for the transfer of data to and from the quantum computing device 2200. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2212 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2212 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2212 may operate in accordance with other wireless protocols in other embodiments. The quantum computing device 2200 may include an antenna 2222 to facilitate wireless communications and/or to receive other wireless communications (such as AM or FM radio transmissions).

In some embodiments, the communication chip 2212 may manage wired communications, such as electrical, optical, or any other suitable communication protocols (e.g., the Ethernet). As noted above, the communication chip 2212 may include multiple communication chips. For instance, a first communication chip 2212 may be dedicated to shorter-range wireless communications such as Wi-Fi or Bluetooth, and a second communication chip 2212 may be dedicated to longer-range wireless communications such as GPS, EDGE, GPRS, CDMA, WiMAX, LTE, EV-DO, or others. In some embodiments, a first communication chip 2212 may be dedicated to wireless communications, and a second communication chip 2212 may be dedicated to wired communications.

The quantum computing device 2200 may include battery/power circuitry 2214. The battery/power circuitry 2214 may include one or more energy storage devices (e.g., batteries or capacitors) and/or circuitry for coupling components of the quantum computing device 2200 to an energy source separate from the quantum computing device 2200 (e.g., AC line power).

The quantum computing device 2200 may include a display device 2206 (or corresponding interface circuitry, as discussed above). The display device 2206 may include any visual indicators, such as a heads-up display, a computer monitor, a projector, a touchscreen display, a liquid crystal display (LCD), a light-emitting diode display, or a flat panel display, for example.

The quantum computing device 2200 may include an audio output device 2208 (or corresponding interface circuitry, as discussed above). The audio output device 2208 may include any device that generates an audible indicator, such as speakers, headsets, or earbuds, for example.

The quantum computing device 2200 may include an audio input device 2218 (or corresponding interface circuitry, as discussed above). The audio input device 2218 may include any device that generates a signal representative of a sound, such as microphones, microphone arrays, or digital instruments (e.g., instruments having a musical instrument digital interface (MIDI) output).

The quantum computing device 2200 may include a global positioning system (GPS) device 2216 (or corresponding interface circuitry, as discussed above). The GPS device 2216 may be in communication with a satellite-based system and may receive a location of the quantum computing device 2200, as known in the art.

The quantum computing device 2200 may include an other output device 2210 (or corresponding interface circuitry, as discussed above). Examples of the other output device 2210 may include an audio codec, a video codec, a printer, a wired or wireless transmitter for providing information to other devices, or an additional storage device.

The quantum computing device 2200 may include an other input device 2220 (or corresponding interface circuitry, as discussed above). Examples of the other input device 2220 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

SELECT EXAMPLES

The following paragraphs provide some select examples of various ones of the embodiments disclosed herein.

Example 1 provides a quantum circuit assembly that includes a substrate, one or more qubit devices provided over the substrate, a common ground plane for the one or more qubit devices, and a flux bias line structure. The flux bias structure may include at least one portion terminating with a designated ground connection (i.e. a ground connection that is designated specifically for said flux bias line) that is electrically isolated from the common ground plane. Thus, the designated ground connection does not electrically connect, or terminate at, one of ground planes of the flux bias line structure.

Example 2 provides the quantum circuit assembly according to Example 1, where the common ground plane and the flux bias line structure are provided over the substrate, the substrate is a first substrate (i.e. a qubit die/substrate), the quantum circuit assembly further includes a second substrate (i.e. a package substrate) connected to the first substrate via one or more first level interconnects, and the ground connection electrically connects the flux bias line structure to a further ground connection of the package substrate.

Example 3 provides the quantum circuit assembly according to Examples 1 or 2, where at least one of the one or more qubit devices includes a SQUID, a portion of the flux bias line structure is proximate to the SQUID, and the SQUID and the portion of the flux bias line structure are provided in a plane above the common ground plane.

Example 4 provides the quantum circuit assembly according to Examples 1 or 2, where at least one of the one or more qubit devices includes a SQUID, the substrate includes a raised portion that is elevated with respect to other portions of the substrate, and the SQUID and a portion of the flux bias line structure closest to the SQUID are provided over the raised portion.

Example 5 provides the quantum circuit assembly according to any one of Examples 1-4, where the flux bias line structure includes a single center conductor line split into two center conductor lines, each of the two center conductor lines forming a partial loop.

Example 6 provides the quantum circuit assembly according to Example 5, where at least one of the two center conductor lines terminates with a designated ground connection that is electrically isolated from the common ground plane.

Example 7 provides the quantum circuit assembly according to Examples 5 or 6, where each of the two center conductor lines terminates with a designated ground connection that is electrically isolated from the common ground plane.

Example 8 provides the quantum circuit assembly according to any one of Examples 1-4, where the flux bias line structure includes a single center conductor line forming two partial loops.

Example 9 provides the quantum circuit assembly according to Example 8, where the two partial loops are arranged so that a current flowing through the signal center conductor line generates magnetic fields of opposite directions within the two partial loops.

Example 10 provides the quantum circuit assembly according to Examples 8 or 9, where a portion of one of the two partial loops is at a distance between 100 and 15,000 nm from a portion of the SQUID.

Example 11 provides the quantum circuit assembly according to any one of Examples 8-10, where an area enclosed by each of the two partial loops is between 10,000 square nm and 2500 square micrometers.

Example 12 provides the quantum circuit assembly according to any one of Examples 8-11, where a perimeter of each of the two partial loops is between 600 and 250,000 nm.

Example 13 provides the quantum circuit assembly according to any one of Examples 1-4, where the flux bias line structure includes a single center conductor line split into two center conductor lines, each of the two center conductor lines forming a partial loop and including a inductor.

Example 14 provides the quantum circuit assembly according to Example 13, where the at least one portion terminating with the designated ground connection is one of the two center conductor lines.

Example 15 provides the quantum circuit assembly according to Example 13, where each of the two center conductor lines terminates with a designated ground connection that is electrically isolated from the common ground plane.

Example 16 provides the quantum circuit assembly according to any one of Examples 13-15, where the inductor in one of the two center conductor lines has a kinetic inductance equal to that of the inductor in another one of the two center conductor lines.

Example 17 provides the quantum circuit assembly according to any one of Examples 13-16, where the two center conductor lines are arranged so that, when current flows through a first one of the two center conductor lines, a magnetic field in a first direction is generated within the partial loop formed by the first center conductor line, and, when current flows through a second one of the two center conductor lines, a magnetic field in a second direction is generated within the partial loop formed by the second center conductor line, the second direction being opposite to the first direction.

Example 18 provides the quantum circuit assembly according to any one of Examples 13-17, where a portion of the partial loop formed by the first center conductor line or by the second center conductor line is at a distance between 100 and 15,000 nm from a portion of the SQUID.

Example 19 provides the quantum circuit assembly according to any one of Examples 1-4, where the flux bias line structure includes two center conductor lines, each of the two center conductor lines forming a partial loop.

Example 20 provides the quantum circuit assembly according to Example 19, where the at least one of the two center conductor lines terminates with a designated ground that is electrically isolated from the common ground plane.

Example 21 provides the quantum circuit assembly according to Examples 19 or 20, where each of the two center conductor lines terminates with a designated ground that is electrically isolated from the common ground plane.

Example 22 provides the quantum circuit assembly according to any one of Examples 19-21, where the two center conductor lines are arranged so that, when current flows through a first one of the two center conductor lines, a magnetic field in a first direction is generated within the partial loop formed by the first center conductor line, and, when current flows through a second one of the two center conductor lines, a magnetic field in a second direction is generated within the partial loop formed by the second center conductor line, the second direction being opposite to the first direction.

Example 23 provides the quantum circuit assembly according to any one of Examples 19-22, where a portion of the partial loop formed by the first center conductor line or by the second center conductor line is at a distance between 100 and 15,000 nm from a portion of the SQUID.

Example 24 provides a quantum circuit assembly that includes a substrate, the substrate including a raised portion that is elevated with respect to at least one other portion of the substrate; at least one qubit device provided over the substrate, the at least one qubit device including a SQUID; and a flux bias line structure for the at least one qubit device, where the SQUID and a portion of the flux bias line structure closest to the SQUID are provided over the raised portion of the substrate.

Example 25 provides the quantum circuit assembly according to Example 24, where the flux bias line structure includes a single center conductor line split into two center conductor lines, each of the two center conductor lines forming a partial loop.

Example 26 provides the quantum circuit assembly according to Example 24, where the flux bias line structure includes a single center conductor line forming two partial loops.

Example 27 provides the quantum circuit assembly according to Example 26, where the two partial loops are arranged so that a current flowing through the signal center conductor line generates magnetic fields of opposite directions within the two partial loops.

Example 28 provides the quantum circuit assembly according to Examples 26 or 27, where a portion of one of the two partial loops is at a distance between 100 and 15,000 nm from a portion of the SQUID.

Example 29 provides the quantum circuit assembly according to any one of Examples 26-28, where an area enclosed by each of the two partial loops is between 10,000 square nm and 2500 square micrometers.

Example 30 provides the quantum circuit assembly according to any one of Examples 26-29, where a perimeter of each of the two partial loops is between 600 and 250,000 nm.

Example 31 provides the quantum circuit assembly according to any one of Examples 26-30, where the single center conductor line terminates with a connection to ground.

Example 32 provides the quantum circuit assembly according to any one of Examples 26-30, where the single center conductor line includes one input signal connection and one output signal connection.

Example 33 provides the quantum circuit assembly according to Example 24, where the flux bias line structure includes a single center conductor line split into two center conductor lines, each of the two center conductor lines forming a partial loop and including a inductor.

Example 34 provides the quantum circuit assembly according to Example 33, where the inductor in one of the two center conductor lines has a kinetic inductance equal to that of the inductor in another one of the two center conductor lines.

Example 35 provides the quantum circuit assembly according to Examples 33 or 34, where the two center conductor lines are arranged so that, when current flows through a first one of the two center conductor lines, a magnetic field in a first direction is generated within the partial loop formed by the first center conductor line, and, when current flows through a second one of the two center conductor lines, a magnetic field in a second direction is generated within the partial loop formed by the second center conductor line, the second direction being opposite to the first direction.

Example 36 provides the quantum circuit assembly according to any one of Examples 33-35, where a portion of the partial loop formed by the first center conductor line or by the second center conductor line is at a distance between 100 and 15,000 nm from a portion of the SQUID.

Example 37 provides the quantum circuit assembly according to Example 24, where the flux bias line structure includes two center conductor lines, each of the two center conductor lines forming a partial loop.

Example 38 provides the quantum circuit assembly according to Example 37, where the two center conductor lines are arranged so that, when current flows through a first one of the two center conductor lines, a magnetic field in a first direction is generated within the partial loop formed by the first center conductor line, and, when current flows through a second one of the two center conductor lines, a magnetic field in a second direction is generated within the partial loop formed by the second center conductor line, the second direction being opposite to the first direction.

Example 39 provides the quantum circuit assembly according to Examples 37 or 38, where a portion of the partial loop formed by the first center conductor line or by the second center conductor line is at a distance between 100 and 15,000 nm from a portion of the SQUID.

Example 40 provides the quantum circuit assembly according to Example 24, where the flux bias line structure includes a single center conductor line forming at least partial loop.

Example 41 provides the quantum circuit assembly according to Example 40, where the single center conductor line includes one input signal connection and one output signal connection.

Example 42 provides the quantum circuit assembly according to Example 40, where the single center conductor line terminates with a connection to ground.

Example 43 provides the quantum circuit assembly according to any one of Examples 24-42, where the SQUID includes two Josephson Junctions and a loop of one or more superconductive materials.

Example 44 provides a quantum computing device that includes a quantum processing device having a die with a quantum circuit assembly according to any one of the preceding Examples, the quantum circuit assembly including a plurality of qubits; and a memory device configured to store data generated by the plurality of qubits during operation of the quantum processing device.

Example 45 provides the quantum computing device according to Example 44, further including a cooling apparatus configured to maintain a temperature of the quantum processing device below 5 degrees Kelvin.

Example 46 provides the quantum computing device according to Examples 44 or 45, where the memory device is configured to store instructions for a quantum computing algorithm to be executed by the quantum processing device.

Example 47 provides the quantum computing device according to any one of Examples 44-46, further including a non-quantum processing device coupled to the quantum processing device.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A quantum circuit assembly, comprising:
a qubit device over a substrate, the qubit device including a superconducting quantum interference device (SQUID);
a common ground plane for the qubit device; and
a flux bias line structure comprising a single conductor line forming two incomplete loops and terminating with a ground connection that is electrically isolated from the common ground plane, and having a portion configured to magnetically couple to the SQUID.

2. The quantum circuit assembly according to claim 1, wherein:
the common ground plane and the flux bias line structure are over the substrate,
the substrate is a first substrate;
the quantum circuit assembly further includes a second substrate connected to the first substrate via one or more interconnects, and
the ground connection connects the flux bias line structure to a further ground connection of the package substrate.

3. The quantum circuit assembly according to claim 1, wherein:
the qubit device includes a superconducting quantum interference device (SQUID),
a top surface of the substrate includes a raised portion that is elevated with respect to other portions of the top surface of the substrate, and
the SQUID and a portion of the flux bias line structure closest to the SQUID are over the raised portion.

4. The quantum circuit assembly according to claim 1, wherein the two incomplete loops are arranged so that a current flowing through the single conductor line generates magnetic fields of opposite directions within the two incomplete loops.

5. The quantum circuit assembly according to claim 1, wherein a portion of one of the two incomplete loops is at a distance between 100 and 15,000 nanometers from a portion of the SQUID, an area enclosed by each of the two partial loops is between 10,000 square nanometers and 2500 square micrometers, and a perimeter of each of the two partial loops is between 600 and 250,000 nanometers.

6. The quantum circuit assembly according to claim 1, wherein the flux bias line structure is not in electrical contact with the SQUID.

7. The quantum circuit assembly according to claim 1, wherein the two incomplete loops of the single conductor line are located so that a magnetic field generated by a current in a first of the two incomplete loops is configured to couple to the SQUID, and
a magnetic field generated by a current in a second of the two incomplete loops is configured to not couple to the SQUID.

8. The quantum circuit assembly according to claim 1, wherein:
the qubit device is one of a plurality of qubit devices of the quantum circuit assembly,
the quantum circuit assembly is a part of a quantum processing device of a quantum computing device, and
the quantum computing device further includes a memory device configured to store data generated by the plurality of qubits during operation of the quantum processing device.

9. The quantum circuit assembly according to claim 8, wherein the quantum computing device further includes a cooling apparatus configured to maintain a temperature of the quantum processing device below 5 degrees Kelvin.

10. A quantum circuit assembly, comprising:
a qubit device over a substrate, the qubit device including a superconducting quantum interference device (SQUID);
a common ground plane for the qubit device; and
a flux bias line structure comprising a single conductor line split into two conductor lines, where:
each of the two conductor lines forms a partial loop and includes an inductor,
at least one of the two conductor lines terminates with a ground connection that is electrically isolated from the common ground plane, and
the flux bias line structure has a portion configured to magnetically couple to the SQUID.

11. The quantum circuit assembly according to claim 10, wherein the two conductor lines are located so that, in operation,
a magnetic field generated by a current in the partial loop of a first of the two conductor lines is configured to couple to the SQUID, and
a magnetic field generated by a current in the partial loop of a second of the two conductor lines is configured to not couple to the SQUID.

12. The quantum circuit assembly according to claim 10, wherein the flux bias line structure is not in electrical contact with the SQUID.

13. The quantum circuit assembly according to claim 10, wherein each of the two conductor lines terminates with a respective ground connection that is electrically isolated from the common ground plane.

14. The quantum circuit assembly according to claim 10, wherein the inductor in one of the two conductor lines has a kinetic inductance equal to that of the inductor in another one of the two conductor lines.

15. The quantum circuit assembly according to claim 10, wherein the two conductor lines are arranged so that, when current flows through a first one of the two conductor lines, a magnetic field in a first direction is generated within the partial loop formed by the first conductor line, and, when current flows through a second one of the two conductor lines, a magnetic field in a second direction is generated within the partial loop formed by the second conductor line, the second direction being opposite to the first direction.

16. The quantum circuit assembly according to claim 10, wherein:
the qubit device is one of a plurality of qubit devices of the quantum circuit assembly,
the quantum circuit assembly is a part of a quantum processing device of a quantum computing device, and
the quantum computing device further includes a memory device configured to store data generated by the plurality of qubits during operation of the quantum processing device.

17. The quantum circuit assembly according to claim 16, wherein the quantum computing device further includes a cooling apparatus configured to maintain a temperature of the quantum processing device below 5 degrees Kelvin.

18. A quantum circuit assembly, comprising:
a qubit device over a substrate, the qubit device including a superconducting quantum interference device (SQUID);
a common ground plane for the qubit device; and
a flux bias line structure comprising two conductor lines, where:
each of the two conductor lines forms a partial loop,
at least one of the two conductor lines terminates with a ground connection that is electrically isolated from the common ground plane, and
the partial loop of a first conductor line of the two conductor lines has a portion configured to magnetically couple to the SQUID.

19. The quantum circuit assembly according to claim 18, wherein the two conductor lines are located so that, in operation,
a magnetic field generated by a current in the partial loop of the first conductor line is configured to couple to the SQUID, and
a magnetic field generated by a current in the partial loop of a second conductor line of the two conductor lines is configured to not couple to the SQUID.

20. The quantum circuit assembly according to claim 18, wherein no part of the flux bias line structure is in electrical contact with the SQUID.

21. The quantum circuit assembly according to claim 18, wherein each of the two conductor lines terminates with a respective ground connection that is electrically isolated from the common ground plane.

22. The quantum circuit assembly according to claim 18, wherein the two conductor lines are arranged so that, when current flows through a first one of the two conductor lines, a magnetic field in a first direction is generated within the partial loop formed by the first conductor line, and, when current flows through a second one of the two conductor lines, a magnetic field in a second direction is generated within the partial loop formed by a second conductor line of the two conductor lines, the second direction being opposite to the first direction.

23. The quantum circuit assembly according to claim 18, wherein a portion of the partial loop of the first conductor line is at a distance between 100 and 15,000 nanometers from a portion of the SQUID, an area enclosed by each of the two partial loops is between 10,000 square nanometers and 2500 square micrometers, and a perimeter of each of the two partial loops is between 600 and 250,000 nanometers.

24. The quantum circuit assembly according to claim 18, wherein:
   the qubit device is one of a plurality of qubit devices of the quantum circuit assembly,
   the quantum circuit assembly is a part of a quantum processing device of a quantum computing device, and
   the quantum computing device further includes a memory device configured to store data generated by the plurality of qubits during operation of the quantum processing device.

25. The quantum circuit assembly according to claim 24, wherein the quantum computing device further includes a cooling apparatus configured to maintain a temperature of the quantum processing device below 5 degrees Kelvin.

* * * * *

UNITED STATES PATENT AND TRADEMARK OFFICE
CERTIFICATE OF CORRECTION

PATENT NO. : 10,847,705 B2
APPLICATION NO. : 15/897712
DATED : November 24, 2020
INVENTOR(S) : Lester Lampert et al.

It is certified that error appears in the above-identified patent and that said Letters Patent is hereby corrected as shown below:

On the Title Page

In item (57), in the Abstract, Column 2, Line 12, delete "or" (both occurrences).

Signed and Sealed this
Twenty-ninth Day of December, 2020

Andrei Iancu
*Director of the United States Patent and Trademark Office*